(12) United States Patent
Doi et al.

(10) Patent No.: US 7,701,129 B2
(45) Date of Patent: Apr. 20, 2010

(54) POLYMERIC FLUORESCENT SUBSTANCE AND POLYMER LIGHT-EMITTING DEVICE USING THE SAME

(75) Inventors: Shuji Doi, Tsukuba (JP); Yoshiaki Tsubata, Tsukuba (JP); Takahiro Ueoka, Tsukuba (JP); Shigeru Sasaki, Tsukuba (JP); Takanobu Noguchi, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/995,814

(22) Filed: Nov. 29, 2001

(65) Prior Publication Data
US 2002/0122899 A1 Sep. 5, 2002

(30) Foreign Application Priority Data

Dec. 6, 2000 (JP) ............................. 2000-371180
Mar. 30, 2001 (JP) ............................. 2001-100626

(51) Int. Cl.
H01L 51/54 (2006.01)
C09K 11/06 (2006.01)
C08G 61/00 (2006.01)

(52) U.S. Cl. ..................... 313/504; 313/506; 428/690; 428/917; 257/40; 257/E51.032; 257/E51.036; 528/8; 528/394; 528/397

(58) Field of Classification Search ................ 428/690, 428/917; 313/504, 506; 257/40; 252/301.35; 526/280; 528/4, 8, 394, 397
See application file for complete search history.

(56) References Cited

U.S. PATENT DOCUMENTS

| | | | |
|---|---|---|---|
| 5,298,189 A | 3/1994 | Kauffman | 252/301.17 |
| 5,518,656 A | 5/1996 | Furuta et al. | 252/301.19 |
| 5,792,568 A | 8/1998 | Emoto et al. | 428/690 |
| 5,807,974 A | 9/1998 | Kim et al. | 528/366 |
| 5,945,502 A | 8/1999 | Hsieh et al. | 528/101 |
| 6,169,163 B1 * | 1/2001 | Woo et al. | 528/397 |
| 6,299,796 B1 | 10/2001 | Igarashi | 252/301.16 |
| 6,361,887 B1 * | 3/2002 | Shi et al. | 428/690 |
| 7,214,763 B2 * | 5/2007 | Uckert et al. | 528/408 |

FOREIGN PATENT DOCUMENTS

| | | |
|---|---|---|
| EP | 0 637 621 A1 | 2/1995 |
| EP | 0 672 741 A1 | 9/1995 |
| EP | 0 725 120 A1 | 8/1996 |
| EP | 0 763 532 A2 | 3/1997 |
| EP | 0 901 174 A2 | 3/1999 |
| EP | 0 964 045 A1 | 12/1999 |
| EP | 1 043 382 A2 | 10/2000 |
| JP | 06 073374 A | 3/1994 |
| JP | 08 134189 A | 5/1996 |
| JP | 2000-292930 A | 10/2000 |
| JP | 2000-303066 A | 10/2000 |
| JP | 2000-306673 A | 11/2000 |
| JP | 2000 311785 A | 11/2000 |
| JP | 2002 083683 A | 3/2002 |
| JP | 2002 093582 A | 3/2002 |
| JP | 2004 500463 A | 1/2004 |
| JP | 2004 500464 A | 1/2004 |
| WO | WO 99/20675 A1 | 4/1999 |
| WO | 00 46321 | 8/2000 |
| WO | 01 62822 A1 | 8/2001 |
| WO | 01 62869 A1 | 8/2001 |

OTHER PUBLICATIONS

U.S. Provisional App. No. 60/288,314 (filed May 3, 2001).*
M. Bernius et al., Fluorene-based polymers-preparation and applications, Journal of Materials Science: Materials in Electronics 11, (2000), pp. 111-116.
M. Onoda et al., "Organic Electroluminescence Devices Using Poly(arylene vinylene) Conducting Polymers", Jpn. J. Appl. Phys. vol. 32, Part 1, No. 9A, (Sep. 1993), pp. 3895-3899.
J. Segura et al., "Oligo-2,6-naphthylenevinylenes—New Building Blocks for the Preparation of Photoluminescent Polymeric Materials", Eur. J. Org. Chem., (1999), pp. 643-651.
T. Yamamoto, "Electrochemical Reduction Potential of n-Type π-Conjugated Polymers", Journal of Polymer Science: Part A: Polymer Chemistry, vol. 34, (1996), pp. 997-1001.
M.W. Wagaman et al., "Photoluminescence properties of polynapthalenevinylene (PNV) homopolymers and block copolymers by ring-opening metathesis polymerization (ROMP) and study of their photoluminescence properties", Phil. Trans. R. Soc. Lond. A. 355, (1997), pp. 727-734.
S. Tasch et al., "Red-Orange Electroluminescence with New Soluble and Air-Stable Poly(naphthalene-vinylene)s", Advanced Materials, vol. 7, No. 11, (1995), pp. 903-906.
I. Benjamin et al., "Newly Synthesized Conjugated Copolymers for Light Emitting Diodes", Synthetic Metals, 84, (1997), pp. 401-402 with Abstract.
Abstract of Japanese Patent Application No. 2000-169839, published Jun. 20, 2000.

* cited by examiner

Primary Examiner—Marie R. Yamnitzky
(74) Attorney, Agent, or Firm—Sughrue Mion, PLLC

(57) ABSTRACT

A polymeric fluorescent substance exhibiting fluorescence in the solid state, having a polystyrene reduced number-average molecular weight of $1 \times 10^3$ to $1 \times 10^8$, and comprising one or more repeating units of formula (1) and one or more repeating units of formula (8), $$—Ar_1—(CR_1=CR_2)_n— \qquad (1)$$

$$—Ar_2—(CR_{36}=CR_{37})_n— \qquad (8)$$

wherein $Ar_1$ represents a specific arylene or a divalent heterocyclic compound group, and $Ar_2$ represent an arylene or a divalent heterocyclic compound group other than $Ar_1$. By using the polymeric fluorescent substance, a high performance polymer LED can easily be obtained.

13 Claims, No Drawings

POLYMERIC FLUORESCENT SUBSTANCE AND POLYMER LIGHT-EMITTING DEVICE USING THE SAME

BACKGROUND OF THE INVENTION

1. Field of the Invention

The present invention relates to a polymeric fluorescent substance and more specifically a polymer light-emitting device using the same.

2. Description of the Related Art

Differing from low molecular weight materials, light emitting materials having higher molecular weight (polymeric fluorescent substances) have a merit that they can be dissolved in a solvent, and can form a light emitting layer by a coating method, and various substances have been studied. For example, J. Mater. Sci. Mater. Ele., 11, p. 111 (2000) describes polymers containing unsubstituted naphthalene and fluorene.

An object of the present invention is to provide: a polymeric fluorescent substance comprising a condensed aromatic ring such as naphthalene and an arylene group such as fluorene, and manifesting strong fluorescence; and a polymer LED of high performance which can be driven at lower voltage with high efficiency, using this polymeric fluorescent substance.

SUMMARY OF THE INVENTION

The present inventors have intensively studied in view of the above problems, and resultantly found that a polymeric fluorescent substance comprising a specific condensed aromatic ring having a substituent and an arylene group such as fluorene shows strong fluorescence, and a polymer LED of high performance which can be driven at lower voltage with high efficiency can be obtained using the above-mentioned polymeric fluorescent substance, leading to completion of the invention.

Namely, the present invention relates to a polymeric fluorescent substance exhibiting fluorescence in the solid state, having a polystyrene reduced number-average molecular weight of $1 \times 10^3$ to $1 \times 10^8$, and comprising one or more repeating units of the following general formula (1) and one or more repeating units of formula (8),

  (1).

In the formula, $Ar_1$ is a divalent group represented by the following formulae (2) to (7); $R_1$ and $R_2$ each independently represent a group selected from a hydrogen atom, alkyl groups, aryl groups, monovalent heterocyclic compound groups and cyano group; and n is 0 or 1,

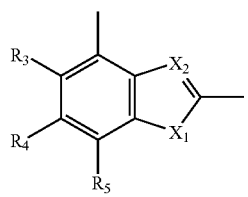 (2)

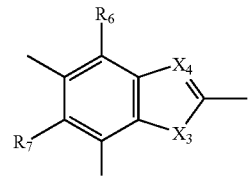 (3)

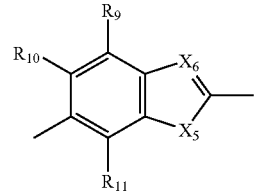 (4)

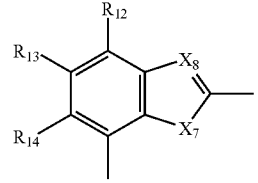 (5)

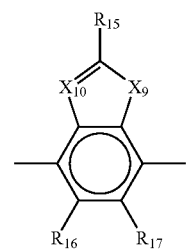 (6)

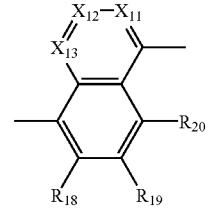 (7)

In formulae (2) to (7), $X_1$, $X_3$, $X_5$, $X_7$ and $X_9$ each independently represent a group selected from —$CR_{21}$=$CR_{22}$—, —$CR_{23}$=N—, —N=$CR_{24}$—, —O—CO—, —$CR_{25}R_{26}$—, —CO—, —O—, —S—, —Se—, —$NR_{27}$— and —$SiR_{28}R_{29}$—; $X_2$, $X_4$, $X_6$, $X_8$ and $X_{10}$ to $X_{13}$ each independently represent a group selected from —$CR_{30}$= and —N=; $R_3$ to $R_{30}$ each independently represent a hydrogen atom or a substituent selected from alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, arylalkenyl group, arylalkynyl group, monovalent heterocyclic compound group and cyano group; at least one of $R_3$ to $R_{30}$ is not a hydrogen atom.

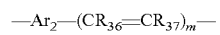 (8)

In the formula, $Ar_2$ represents an arylene group or a divalent heterocyclic compound group, but the group is not represented by any of formulae (2) to (7); $Ar_2$ may have one or more substituents; when $Ar_2$ has a plurality of substituents, they may be the same or different; $R_{36}$ and $R_{37}$ each independently represent a group selected from a hydrogen atom, alkyl groups, aryl groups, monovalent heterocyclic compound groups and a cyano group; and m represents 0 or 1.

Also, the present invention relates to a polymer light emitting device comprising at least a light emitting layer between a pair of electrodes composed of an anode and a cathodes at least one of which is transparent or semi-transparent, wherein the light emitting layer comprises the above polymeric fluorescent substance.

Further, the present invention relates to a flat light source, a segment display, and a dot matrix display, obtained by using the above polymer light emitting device. Furthermore, the present invention relates to a liquid crystal display obtained by using the above polymer light emitting device as a backlight.

DETAILED DESCRIPTION OF THE INVENTION

In the polymeric fluorescent substance of the present invention, $Ar_1$ has one or more substituents which are not hydrogen atom.

Examples of $Ar_1$ include: the following structures of Nos. 4, 15, 19, 22, 25, 28, 31, and 35, as a divalent group shown by formula (2); following structures of Nos. 39, 40, 41, 42, and 43, as a divalent group shown by formula (3); following structures of Nos. 1, 5, 6, 11, 14, 18, 21, 24, 27, 30, 34, 36, and 37, as a divalent group shown by formula (4); following structures of Nos. 44, 45, 46, 47, and 48, as a divalent group shown by formula (5); following structures of Nos. 2, 7, 9, 16, 17, 20, 23, 26, 29, 32, 33, and 38, as a divalent group shown by formula (6); and following structures of Nos. 3, 12, and 13, as a divalent group shown by formula (7). In the structures, at least one of the Rs is not a hydrogen atom. Among them, the structures represented by formula (4) are preferable.

1

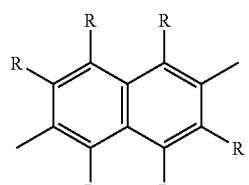

2

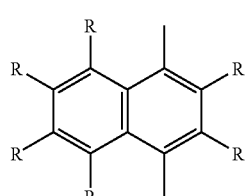

3

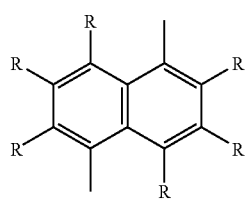

-continued

4

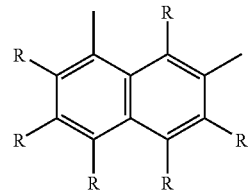

5

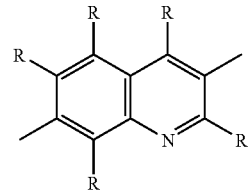

6

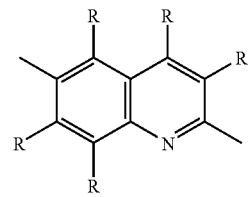

7

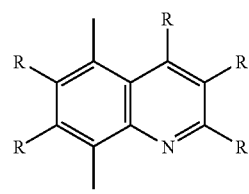

8

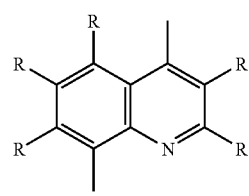

9

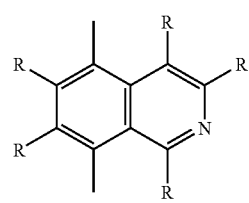

10

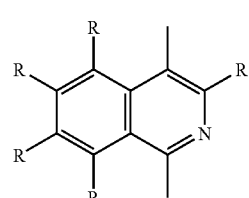

11

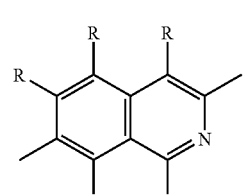

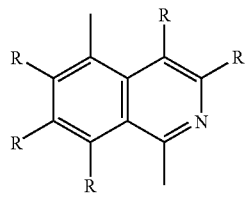
12
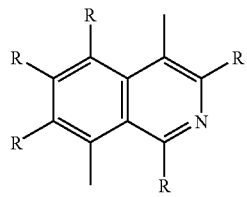
13
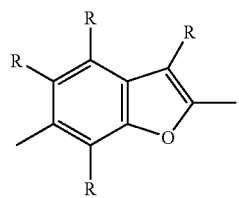
14
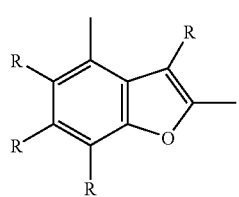
15
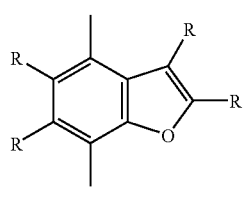
16
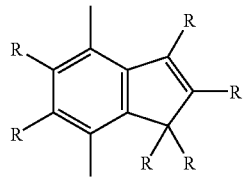
17
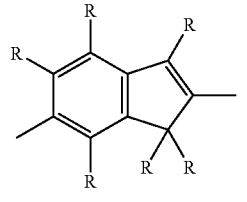
18
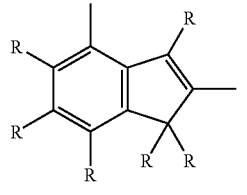
19
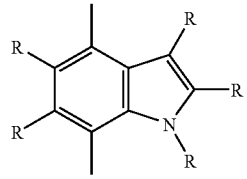
20
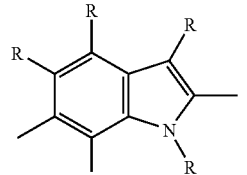
21
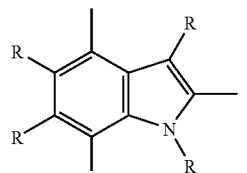
22
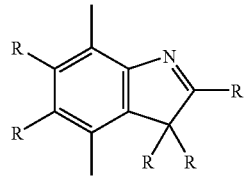
23
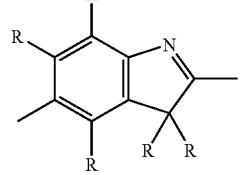
24
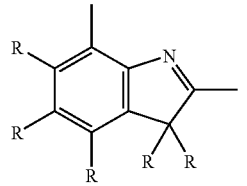
25
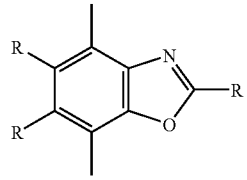
26
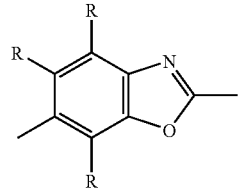
27

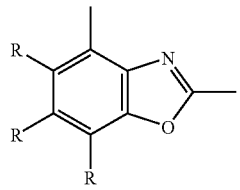
28
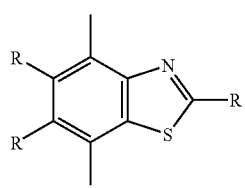
29
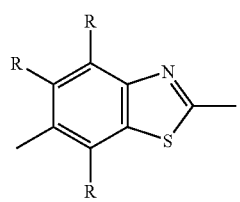
30
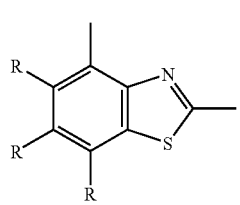
31
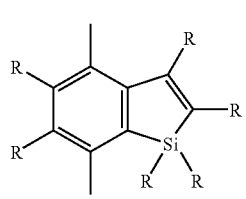
32
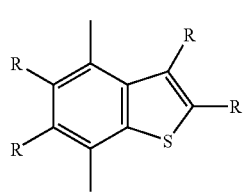
33
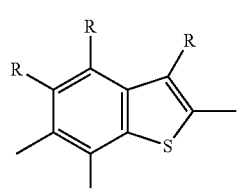
34
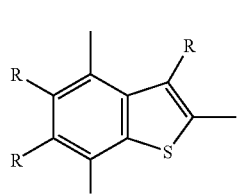
35
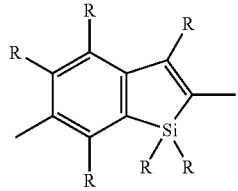
36
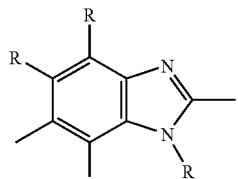
37
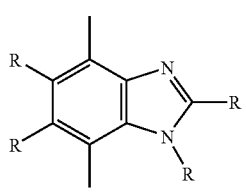
38
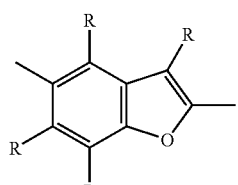
39
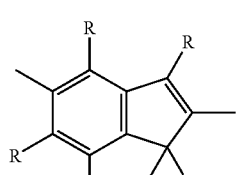
40
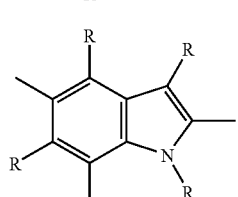
41
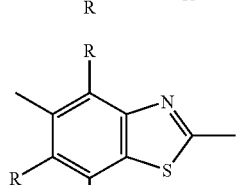
42
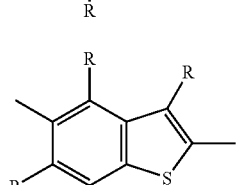
43

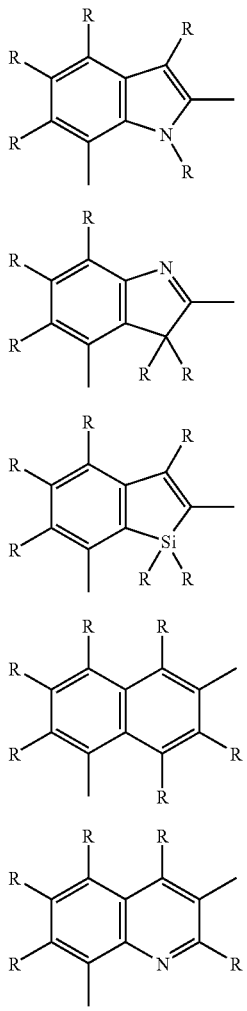

Here, R (namely, $R_3$ to $R_{30}$) represents each independently a group selected from a hydrogen atom, alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, arylalkenyl group, and aryl alkynyl group.

In order to improve the solubility in a solvent, it is suitable to have one or more substituents, and it is preferable that the repeating unit including substituent has a form of little symmetry.

The alkyl group may be linear, branching or cyclic, and has usually about one to 20 carbon atoms. Examples thereof include specifically methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, 3,7-dimethyloctyl group, lauryl group, etc. Among them, pentyl group, hexyl group, octyl group, 2-ethylhexyl group, decyl group, and 3,7-dimethyl octyl group are preferable.

The alkoxy group may be linear, branching or cyclic, and has usually about one to 20 carbon atoms.

Examples thereof include specifically methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group etc. Among them, pentyloxy group, hexyloxy group, octyloxy group, 2-ethylhexyloxy group, decyloxy group, and 3,7-dimethyl octyloxy group are preferable.

The alkylthio group may be linear, branching or cyclic, and has usually about one to 20 carbon atoms. Examples thereof include specifically methylthio group, ethylthio group, propylthio group, and i-propylthio group, butylthio group, i-butylthio group, t-butylthio group, pentylthio group, hexylthio group, cyclo hexylthio group, heptylthio group, octylthio group, 2-ethylhexylthio group, nonylthio group, decylthio group, 3,7-dimethyloctylthio group, laurylthio group etc. Among them, pentylthio group, hexylthio group, octylthio group, 2-ethylhexylthio group, decylthio group, and 3,7-dimethyloctylthio group are preferable.

The alkylsilyl group may be linear, branching or cyclic, and has usually about one to 60 carbon atoms. Examples thereof include specifically methylsilyl group, ethylsilyl group, propylsilyl group, and i-propylsilyl group, butylsilyl group, i-butylsilyl group, t-butylsilyl group, pentylsilyl group, hexylsilyl group, cyclohexylsilyl group, heptylsilyl group, octylsilyl group, 2-ethylhexylsilyl group, nonylsilyl group, decylsilyl group, 3,7-dimethyloctylsilyl group, laurylsilyl group, trimethylsilyl group, ethyldimethylsilyl group, propyldimethylsilyl group, i-propyldimethylsilyl group, butyldimethylsilyl group, t-butyldimethylsilyl group, pentyldimethylsilyl group, hexyldimethylsilyl group, heptyldimethylsilyl group, octyldimethylsilyl group, 2-ethylhexyldimethylsilyl group, nonyldimethylsilyl group, decyldimethylsilyl group, 3,7-dimethyloctyl-dimethylsilyl group, lauryldimethylsilyl group, etc. Among them, pentylsilyl group, hexylsilyl group, octylsilyl group, 2-ethylhexylsilyl group, decylsilyl group, 3,7-dimethyloctylsilyl group, pentyldimethylsilyl group, hexyldimethylsilyl group, octyldimethylsilyl group, 2-ethylhexyl-dimethylsilyl group, decyldimethylsilyl group, 3,7-dimethyloctyl-dimethylsilyl group are preferable.

The alkylamino group may be linear, branching or cyclic, and has usually about one to 40 carbon atoms. Either monoalkylamino group or dialkylamino group may be available. Examples thereof include specifically methylamino group, dimethylamino group, ethylamino group, diethylamino group, propylamino group, i-propylamino group, butylamino group, i-butylamino group, t-butylamino group, pentylamino group, hexylamino group, cyclohexylamino group, heptylamino group, octylamino group, 2-ethylhexylamino group, nonylamino group, decylamino group, 3,7-dimethyloctylamino group, laurylamino group, etc. Among them, pentylamino group, hexylamino group, octylamino group, 2-ethylhexylamino group, decylamino group, and 3,7-dimethyloctylamino group are preferable.

The aryl group has usually about 6 to 60 carbon atoms. Examples thereof include phenyl group, $C_{1-12}$ alkoxyphenyl group ($C_{1-12}$ means that the number of carbon atoms is from 1 to 12), $C_{1-12}$ alkylphenyl group, 1-naphthyl group, 2-naphthyl group, etc. Among them, $C_{1-12}$ alkoxyphenyl group, and $C_{1-12}$ alkylphenyl group are preferable.

The aryloxy group has usually about 6 to 60 carbon atoms. Examples thereof include specifically, phenoxy group, $C_{1-12}$ alkoxyphenoxy group, $C_{1-12}$ alkylphenoxy group, 1-naphthyloxy group, 2-naphthyloxy group, etc. Among them, $C_{1-12}$ alkoxyphenoxy group, and $C_{1-12}$ alkylphenoxy group are preferable.

The arylsilyl group has usually about 6 to 60 carbon atoms. Examples thereof include specifically, phenylsilyl group, $C_{1-12}$ alkoxyphenylsilyl group, $C_{1-12}$ alkylphenylsilyl group, 1-naphthylsilyl group, 2-naphthylsilyl group, dimethylphenylsilyl group, etc. Among them, $C_{1-12}$ alkoxyphenylsilyl group and $C_{1-12}$ alkylphenylsilyl group are preferable.

The arylamino group has usually about 6 to 60 carbon atoms. Examples thereof include specifically, diphenylamino group, $C_{1-12}$ alkoxyphenylamino group, di($C_{1-12}$ alkoxyphenyl)amino group, di($C_{1-12}$ alkylphenyl)amino group, 1-naphthylamino group, 2-naphthylamino group, etc. Among them $C_{1-12}$alkylphenylamino group, and di($C_{1-12}$ alkylphenyl)amino group are preferable.

The arylalkyl group has usually about 7 to 60 carbon atoms. Examples thereof include specifically, phenyl-$C_{1-12}$ alkyl group, $C_{1-12}$alkoxyphenyl-$C_{1-12}$alkyl group, $C_{1-12}$ alkylphenyl-$C_{1-12}$alkyl group, 1-naphthyl-$C_{1-12}$alkyl group, 2-naphthyl-$C_{1-12}$ alkyl group, etc. Among them, $C_{1-12}$alkoxyphenyl-$C_{1-12}$alkyl group, and $C_{1-12}$alkylphenyl-$C_{1-12}$alkyl group are preferable.

The arylalkoxy group has usually about 7 to 60 carbon atoms. Examples thereof include specifically, phenyl-$C_{1-12}$ alkoxy group, $C_{1-12}$alkoxyphenyl-$C_{1-12}$alkoxy group, $C_{1-12}$alkylphenyl-$C_{1-12}$alkoxy group, 1-naphthyl-$C_{1-12}$ alkoxy group, 2-naphthyl-$C_{1-12}$alkoxy group, etc. Among them, $C_{1-12}$alkoxyphenyl-$C_{1-12}$alkoxy group, and $C_{1-12}$alkylphenyl-$C_{1-12}$alkoxy group are preferable.

The arylalkylsilyl group has usually about 7 to 60 carbon atoms. Examples thereof include specifically, phenyl-$C_{1-12}$ alkylsilyl group, $C_{1-12}$alkoxyphenyl-$C_{1-12}$alkylsilyl group, $C_{1-12}$alkylphenyl-$C_{1-12}$alkylsilyl group, 1-naphthyl-$C_{1-12}$ alkylsilyl group, 2-naphthyl-$C_{1-12}$alkylsilyl group, phenyl-$C_{1-12}$alkyldimethylsilyl group, etc. Among them, $C_{1-12}$alkoxyphenyl-$C_{1-12}$alkylsilyl group, and $C_{1-12}$ alkylphenyl-$C_{1-12}$ alkylsilyl group are preferable.

The arylalkylamino group has usually about 7 to 60 carbon atoms. Examples thereof include specifically, phenyl-$C_{1-12}$ alkylamino group, $C_{1-12}$alkoxyphenyl-$C_{1-12}$alkylamino group, $C_{1-12}$alkylphenyl-$C_{1-12}$alkylamino group, di($C_{1-12}$ alkoxyphenyl-$C_{1-12}$alkyl)amino group, di($C_{1-12}$ alkylphenyl-$C_{1-12}$alkyl)amino group, 1-naphthyl-$C_{1-12}$alkylamino group, 2-naphthyl-$C_{1-12}$alkylamino group, etc. Among them, $C_{1-12}$ alkylphenyl-$C_{1-12}$alkylamino group, and di($C_{1-12}$ alkylphenyl-$C_{1-12}$alkyl)amino group are preferable.

The arylalkenyl group has usually about 7 to 60 carbon atoms. Examples thereof include specifically, phenyl-$C_{1-12}$ alkenyl group, $C_{1-12}$alkoxyphenyl-$C_{1-12}$alkenyl group, $C_{1-12}$ alkylphenyl-$C_{1-12}$alkenyl group, 1-naphthyl-$C_{1-12}$alkenyl group, 2-naphthyl-$C_{1-12}$alkenyl group, etc. Among them, $C_{1-12}$ alkoxyphenyl-$C_{1-12}$alkenyl group, and $C_{1-12}$ alkylphenyl-$C_{1-12}$ alkenyl group are preferable.

The arylalkynyl group has usually about 7 to 60 carbon atoms. Examples thereof include specifically, phenyl-$C_{1-12}$ alkynyl group, $C_{1-12}$alkoxyphenyl-$C_{1-12}$alkynyl group, $C_{1-12}$ alkylphenyl-$C_{1-12}$alkynyl group, 1-naphthyl-$C_{1-12}$alkynyl group, 2-naphthyl-$C_{1-12}$alkynyl group, etc. Among them, $C_{1-12}$ alkoxyphenyl-$C_{1-12}$alkynyl group, and $C_{1-12}$ alkylphenyl-$C_{1-12}$ alkynyl group are preferable.

The monovalent heterocyclic compound group means an atomic group of a heterocyclic compound in which one hydrogen atom is removed, and has usually about 4 to 60 carbon atoms. Examples thereof include thienyl group, $C_{1-12}$alkylthienyl group, pyrrolyl group, furyl group, pyridyl group, $C_{1-12}$alkylpyridyl group, etc. Among them, thienyl group, $C_{1-12}$ alkylthienyl group, pyridyl group, and $C_{1-12}$alkylpyridyl group are preferable.

In the substituents containing an alkyl chain among the examples of R, said alkyl chain may be linear, branching or cyclic. Combination thereof may be also included. When the alkyl chain is not linear, examples thereof include iso-amyl group, 2-ethylhexyl group, 3,7-dimethyloctyl group, cyclohexyl group, 4-$C_{1-12}$alkylcyclohexyl group, etc.

In order to improve the solubility of a polymeric fluorescent substance in a solvent, it is suitable that at least one substituent of $Ar_1$ contains an alkyl chain having cyclic or branching structure. Moreover, the alkyl chain may be interrupted with a group containing a hetero atom, —$CR_{31}$=$CR_{32}$—, or —C≡C—.

Here, as a hetero atom, an oxygen atom, a sulfur atom, a nitrogen atom, etc. are exemplified. Examples of the group containing a hetero atom include the following groups.

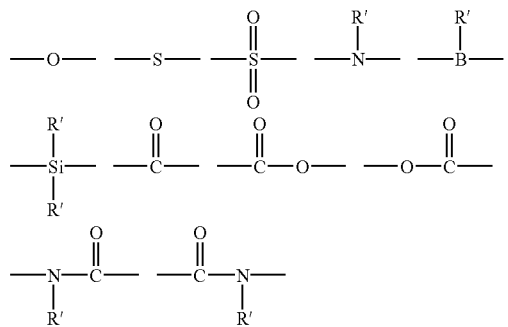

R' means, for example, hydrogen atom, alkyl group having 1 to 20 carbon atoms, aryl group having 6 to 60 carbon atoms, and monovalent heterocyclic compound group having 4 to 60 carbon atoms. $R_{31}$ and $R_{32}$ mean the same with the examples of $R_1$ and $R_2$ below recited.

Furthermore, when an aryl group or a monovalent heterocyclic compound group is included in R as a part of the structure, the group may have one more or more substituents. Moreover, one or more hydrogen atoms contained in the repeating unit represented by formula (1) may be substituted by a halogen atom selected from F, Cl and Br.

In formula (1), n is 0 or 1. $R_1$ and $R_2$ in formula (1) represent each independently a group selected from a hydrogen atom, an alkyl group, an aryl group, a monovalent heterocyclic compound group, and a cyano group.

In the case where $R_1$ and $R_2$ are substituents other than a hydrogen atom or a cyano group, the alkyl group may be linear, branching or cyclic, and has usually about one to 20 carbon atoms. Examples thereof include specifically methyl group, ethyl group, propyl group, butyl group, pentyl group, hexyl group, heptyl group, octyl group, nonyl group, decyl group, lauryl group, etc. Among them, methyl group, ethyl group, pentyl group, hexyl group, heptyl group, and an octyl group are preferable.

The aryl group has usually about 6 to 60 carbon atoms. Examples thereof include specifically phenyl group, $C_{1-12}$ alkoxyphenyl group, $C_{1-12}$alkylphenyl group, 1-naphthyl group, 2-naphthyl group, etc. Among them, phenyl group and $C_{1-12}$ alkylphenyl group are preferable.

The monovalent heterocyclic compound group has usually about 4 to 60 carbon atoms. Examples thereof include specifically thienyl group, $C_{1-12}$ alkylthienyl group, pyrrolyl group, furyl group, pyridyl group, $C_{1-12}$ alkylpyridyl group, etc. Among them, thienyl group, $C_{1-12}$ alkylthienyl group, pyridyl group, and $C_{1-12}$ alkylpyridyl group are preferable.

The polymeric fluorescent substance of the present invention has the repeating unit represented by the following formula (8) as a repeating unit other than formula (1).

$$-Ar_2-(CR_{36}=CR_{37})_m- \quad (8)$$

Here, $Ar_2$ represents an arylene group or a divalent heterocyclic compound group, and $R_{36}$ and $R_{37}$ show each independently a group selected from a hydrogen atom, an alkyl group, an aryl group, a monovalent heterocyclic compound group, and a cyano group. The symbol m is 0 or 1.

In formula (8), $Ar_2$ is an arylene group or a divalent heterocyclic compound group, and is not a group shown by any one of formulae (2) to (7). $Ar_2$ may have one or more substituents. When $Ar_2$ has a plurality substituents, they may be the same or different.

The arylene group includes those having a benzene ring, a condensed ring, and those in which independent benzene rings and/or condensed rings are bonded directly or through groups such as vinylene. The arylene group has usually 6 to 60 carbon atoms, preferably 6 to 20. Examples thereof include: phenylene groups (for example, the below structures of Nos. 1 to 3), naphthalenediyl groups (the below structures of Nos. 4 to 13), anthracenylene groups (the below structures of Nos. 14 to 19), biphenylene groups (the below structures of Nos. 20 to 25), triphenylene groups (the below structures of Nos. 26 to 28), stilbene-diyl (the below structures of A to D), distilbene-diyl (the below structures of E and F), condensed-ring compound groups (the below structures of Nos. 29 to 38), etc. Here, the number of carbon atoms of the substituent is not counted as the number of carbon atoms of the arylene group.

1

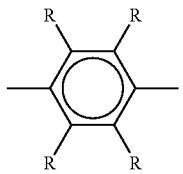

2

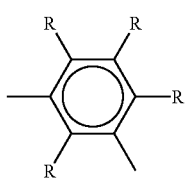

3

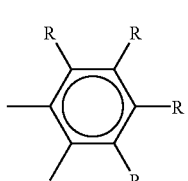

4

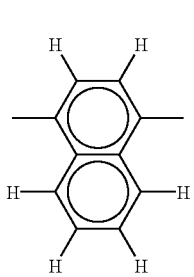

-continued

5

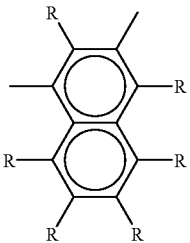

6

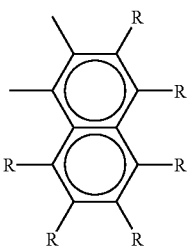

7

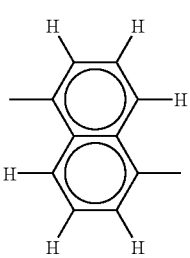

8

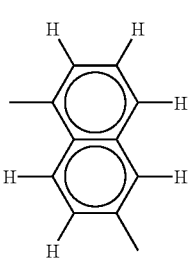

9

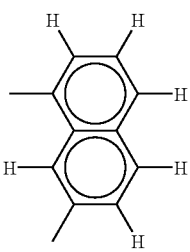

10

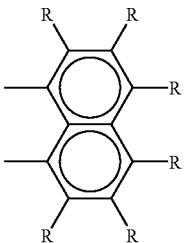

-continued
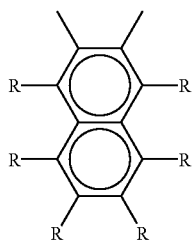
11
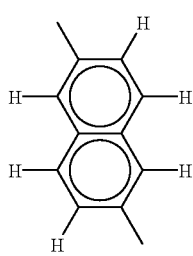
12
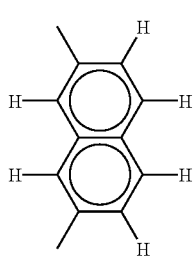
13
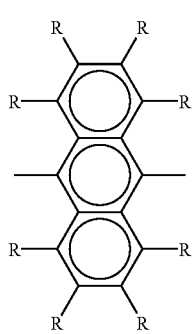
14
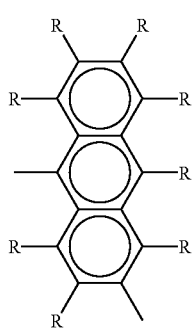
15
-continued
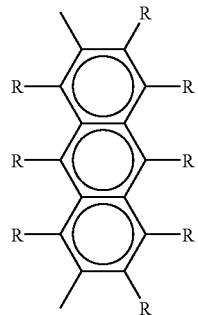
16
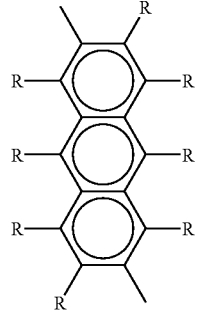
17
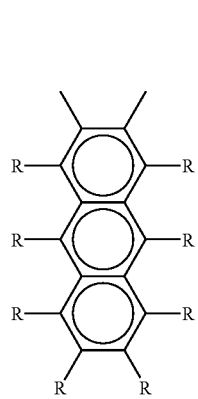
18
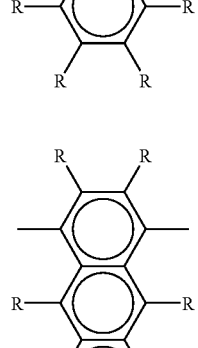
19
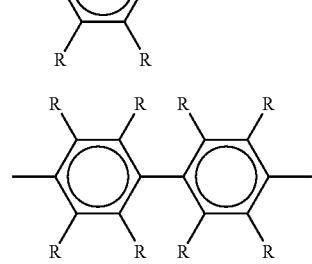
20

-continued
21
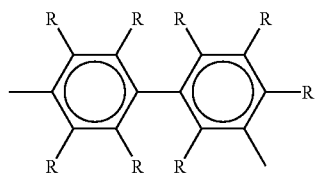
22
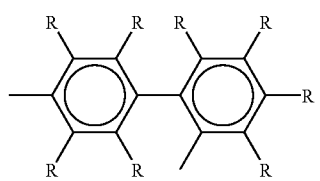
23
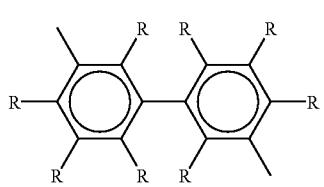
24
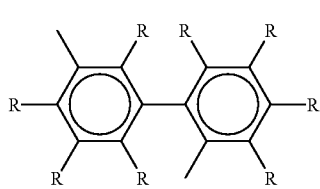
25
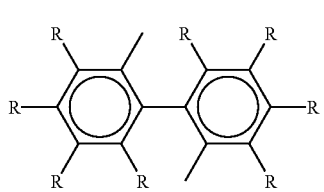
26
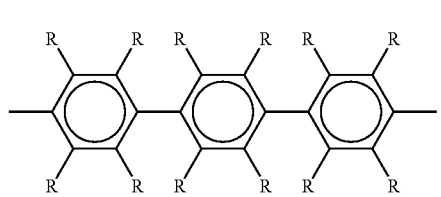
27
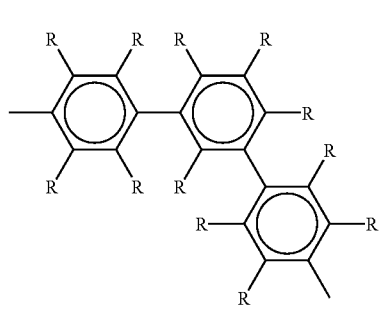
-continued
28
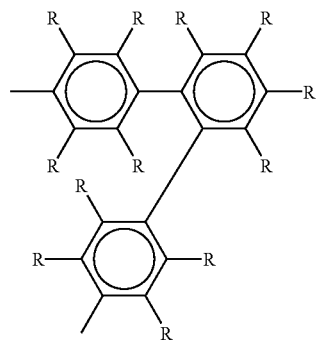
29
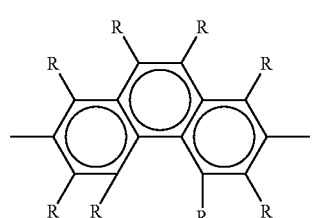
30
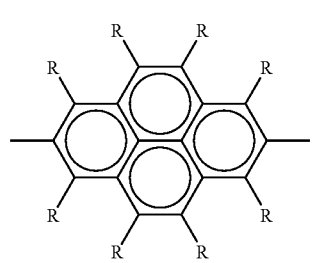
31
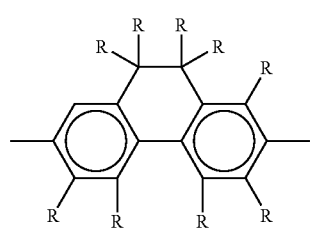
32
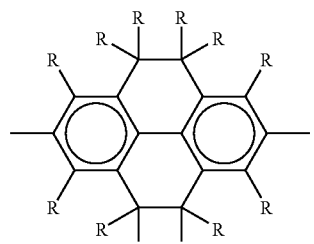
33
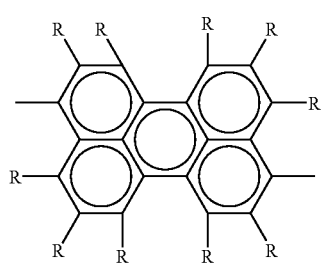

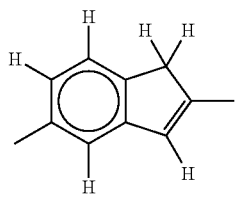

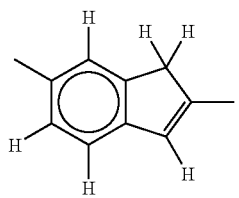

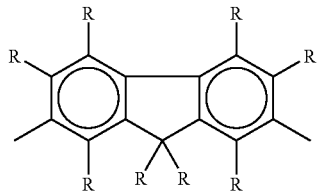

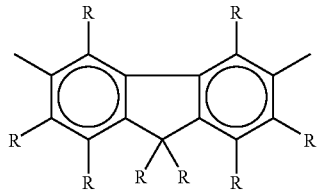

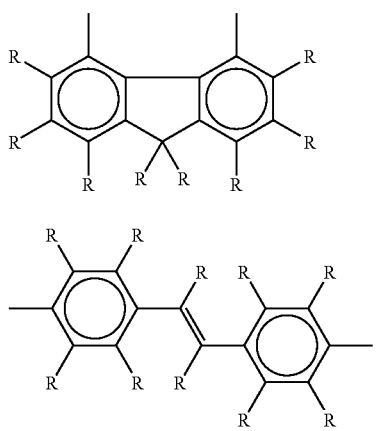

A

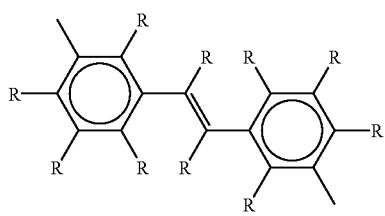

B

34

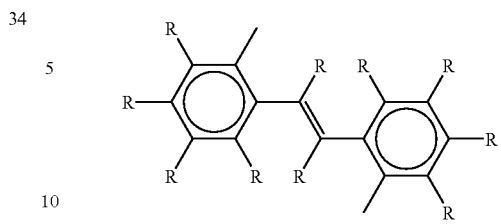

C

35

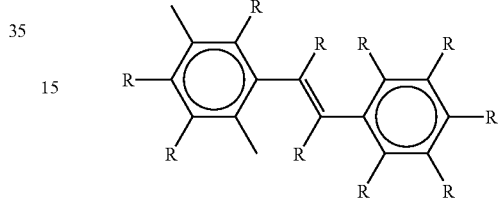

D

36

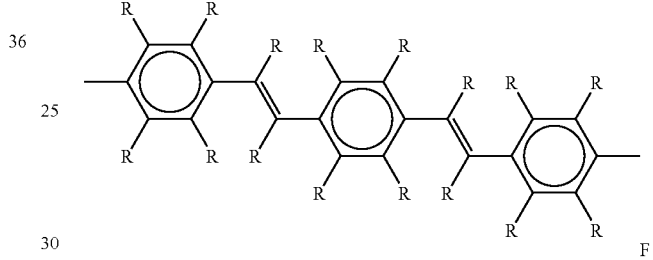

E

37

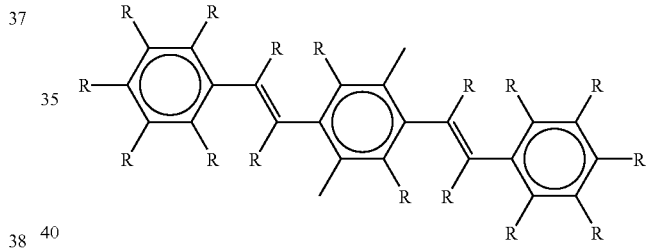

F

38

The divalent heterocyclic compound group means an atomic group of a heterocyclic compound in which two hydrogen atoms are removed, and has usually about 4 to 60, preferably 4 to 20 carbon atoms. Here, the number of carbon atoms of the substituent is not counted as the number of carbon atoms of the divalent heterocyclic compound group.

Here, the heterocyclic compound means that an organic compound having a cyclic structure in which at least one heteroatom such as oxygen, sulfur, nitrogen, phosphor, boron, etc. is contained in the cyclic structure as the element other than carbon atoms.

Examples of the divalent heterocyclic compound group include: divalent heterocyclic compound groups containing nitrogen as the heteroatom, such as: pyridine-diyl groups (the below structures of Nos. 39 to 44), diazaphenylene groups (the below structures of Nos. 45 to 48), quinolinediyl groups (the below structures of Nos. 49 to 63), quinoxalinediyl groups (the below structures of Nos. 64 to 68), acridinediyl groups (the below structures of Nos. 69 to 72), bipyridyldiyl groups (the below structures of Nos. 73 to 75), phenanthrolinediyl groups (the below structures of Nos. 76 to 78), etc.; groups having fluorene structure containing silicon, nitrogen, sulfur, selenium, etc. as the hetero atom (the below structures of Nos. 79 to 93); 5-membered-ring heterocyclic compound groups containing silicon, nitrogen, sulfur, selenium, etc. as the heteroatom (the below structures of Nos. 94 to 98); 5-membered-ring condensed heterocyclic compound groups containing silicon, nitrogen, sulfur, selenium, etc. as the heteroatom (the below structures of Nos. 99 to 110); groups of 5-membered-ring heterocyclic compound groups containing silicon, nitrogen, sulfur, selenium, etc. as the heteroatom, which form dimer or oligomer by bonding at á-position of the hetero atom (the below structures of Nos. 111 to 112); and groups of 5-membered-ring heterocyclic compound groups containing silicon, nitrogen, sulfur, selenium, etc. as the heteroatom, which bond to a phenyl group at á-position of the hetero atom (the below structures of Nos. 113-119).

39
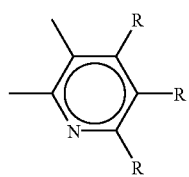

40
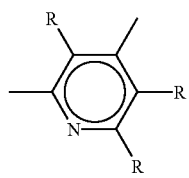

41
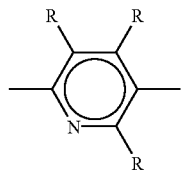

42
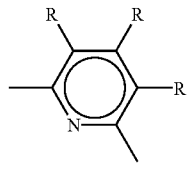

43
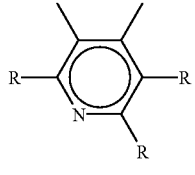

44
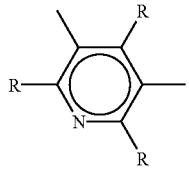

45
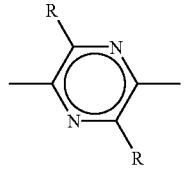

-continued

46
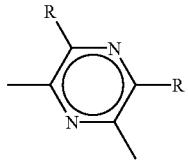

47
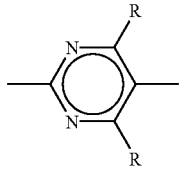

48
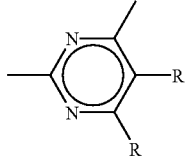

49
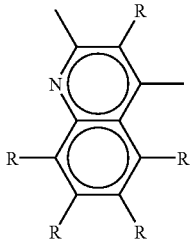

50
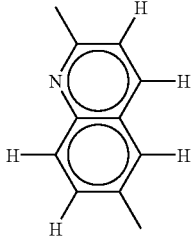

51
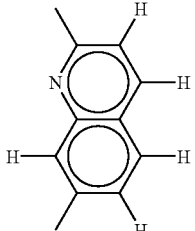

52
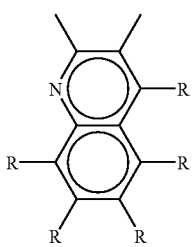

-continued
53
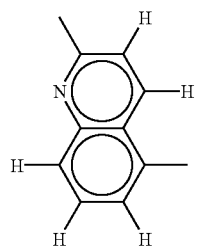
54
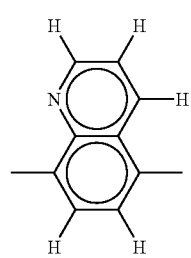
55
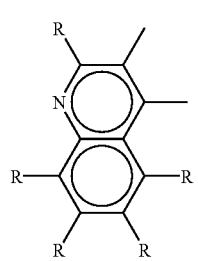
56
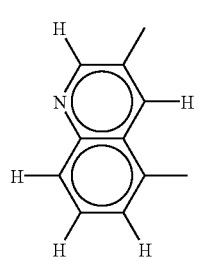
57
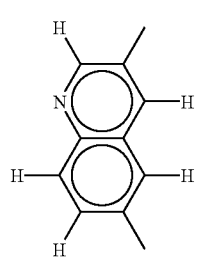
58
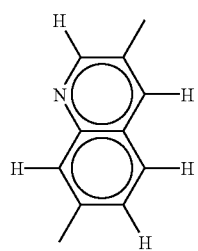
-continued
59
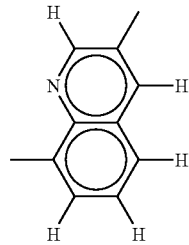
60
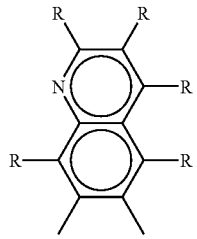
61
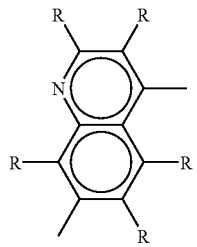
62
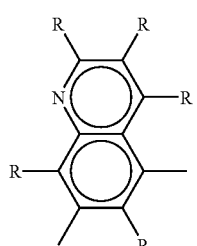
63
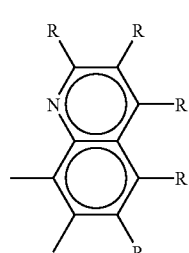
64
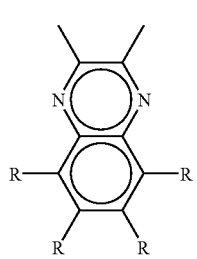

-continued
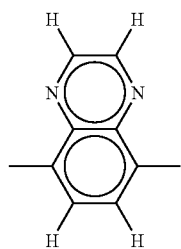
65
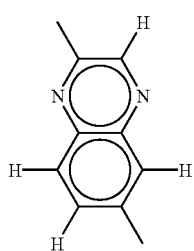
66
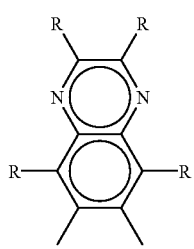
67
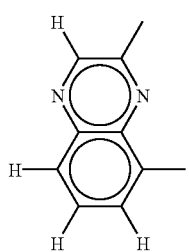
68
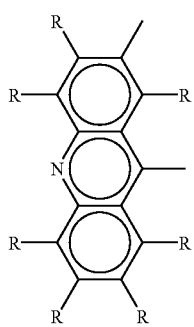
69
-continued
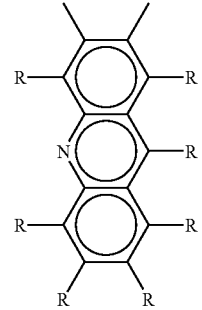
70
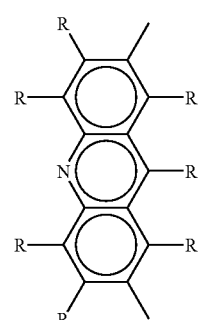
71
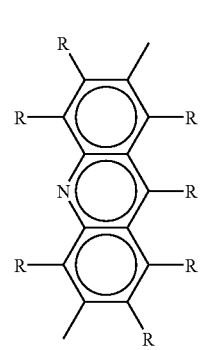
72
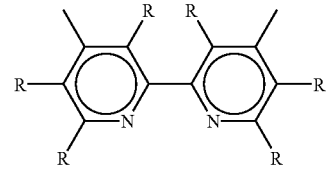
73
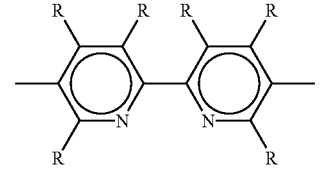
74
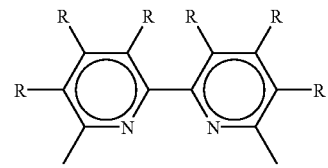
75

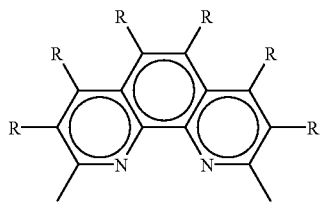
76
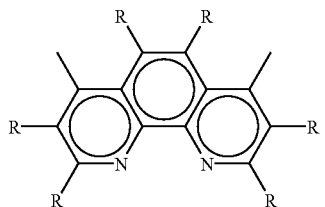
77
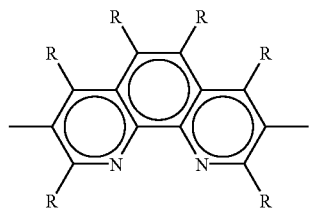
78
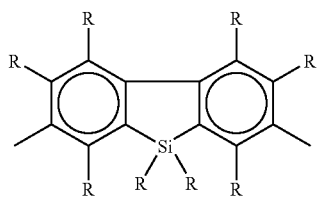
79
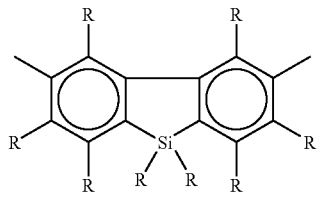
80
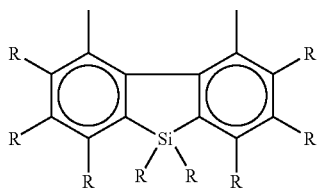
81
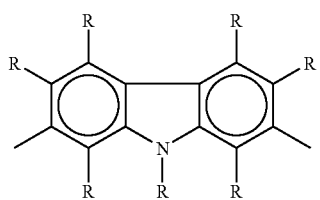
82
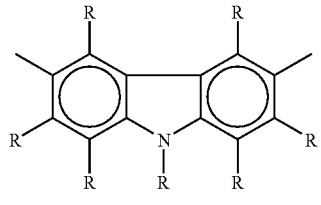
83
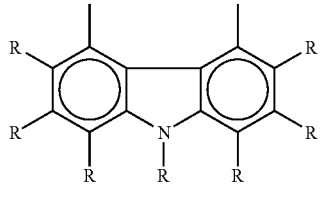
84
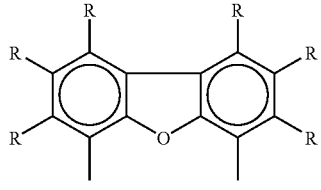
85
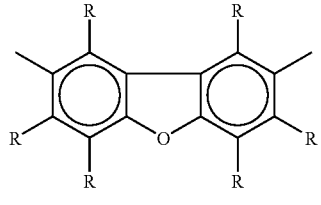
86
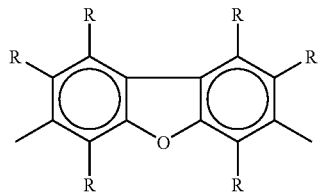
87
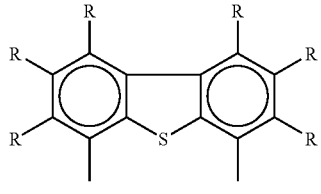
88
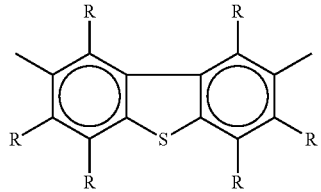
89
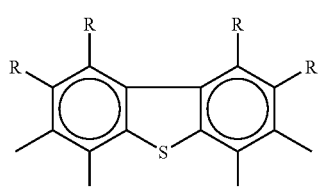
90

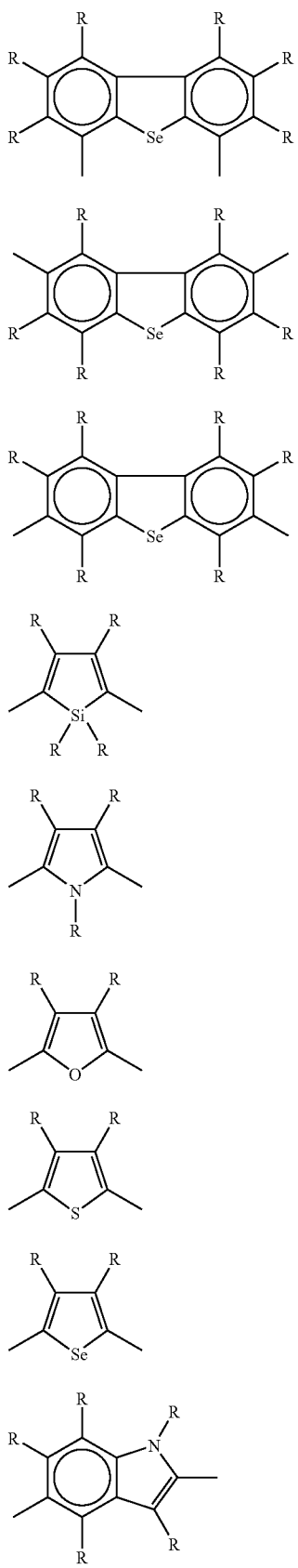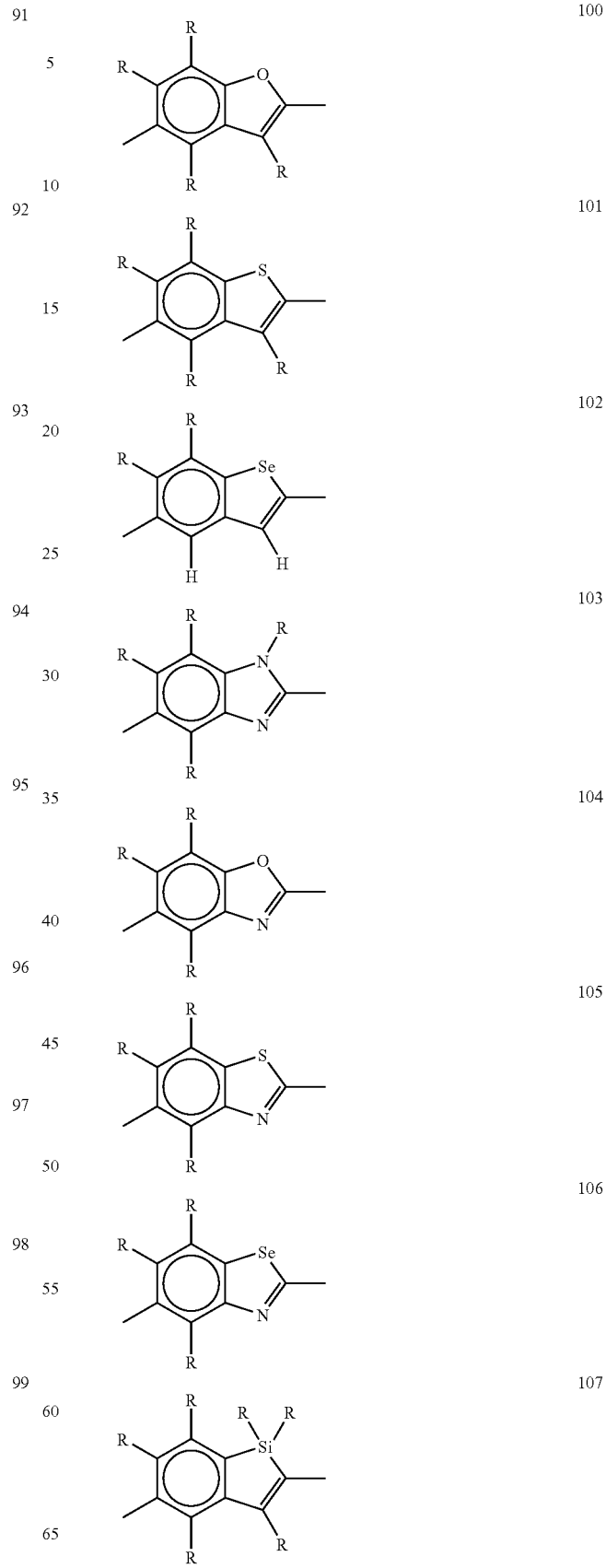

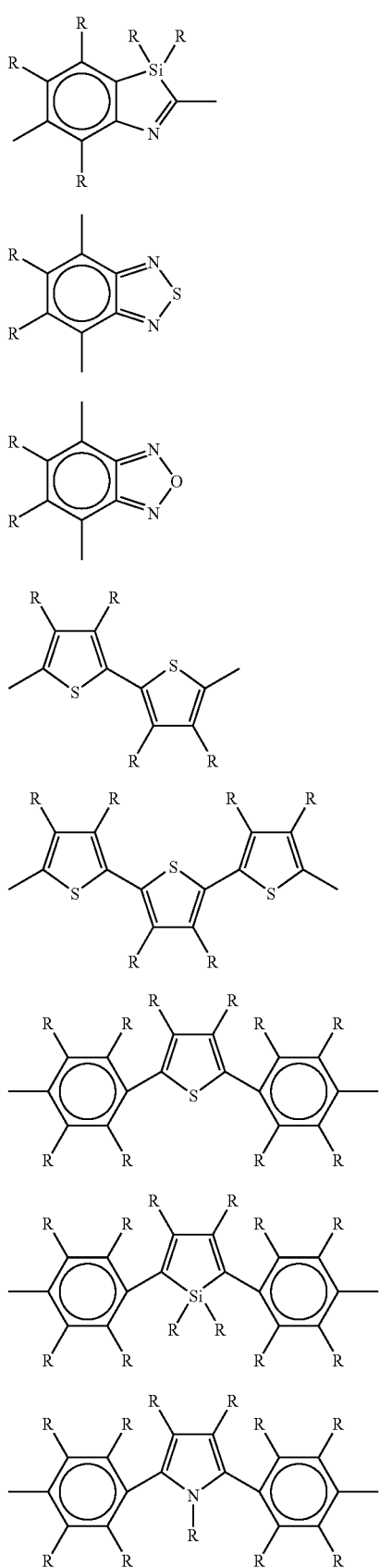
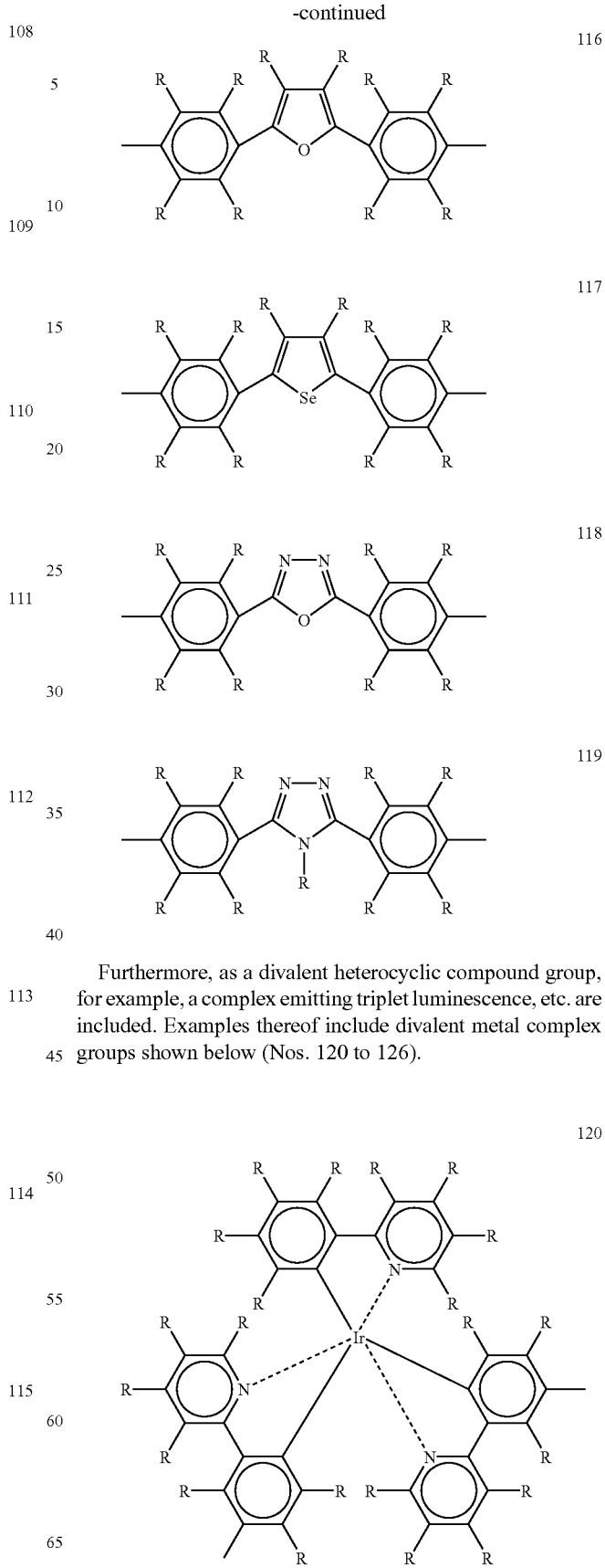
Furthermore, as a divalent heterocyclic compound group, for example, a complex emitting triplet luminescence, etc. are included. Examples thereof include divalent metal complex groups shown below (Nos. 120 to 126).

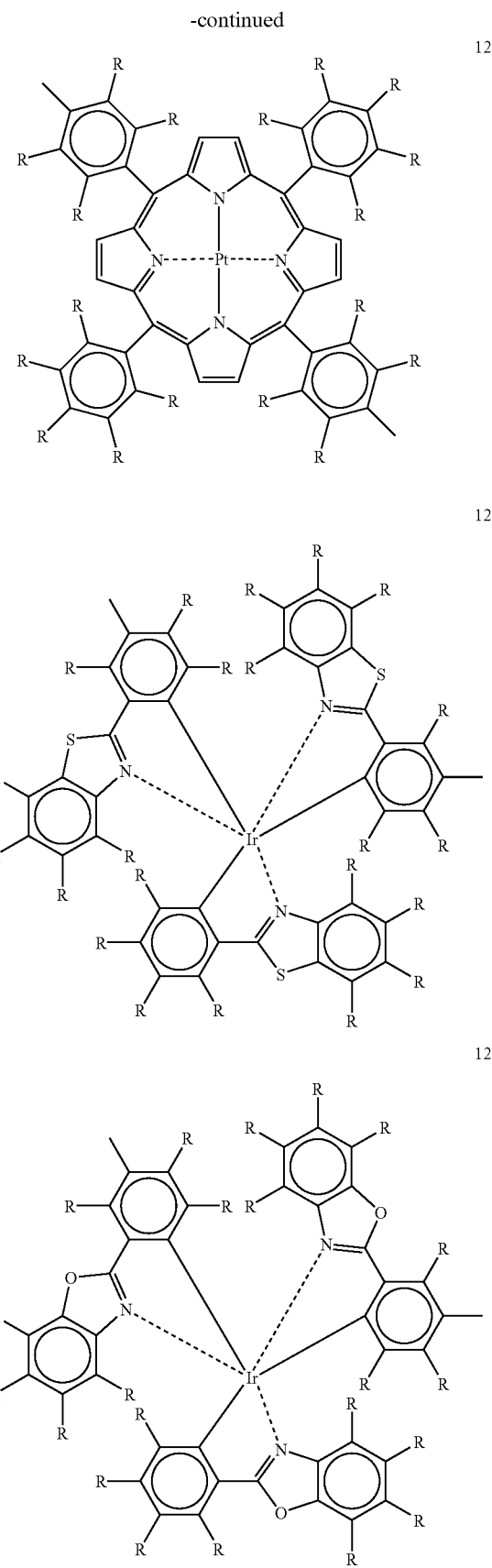
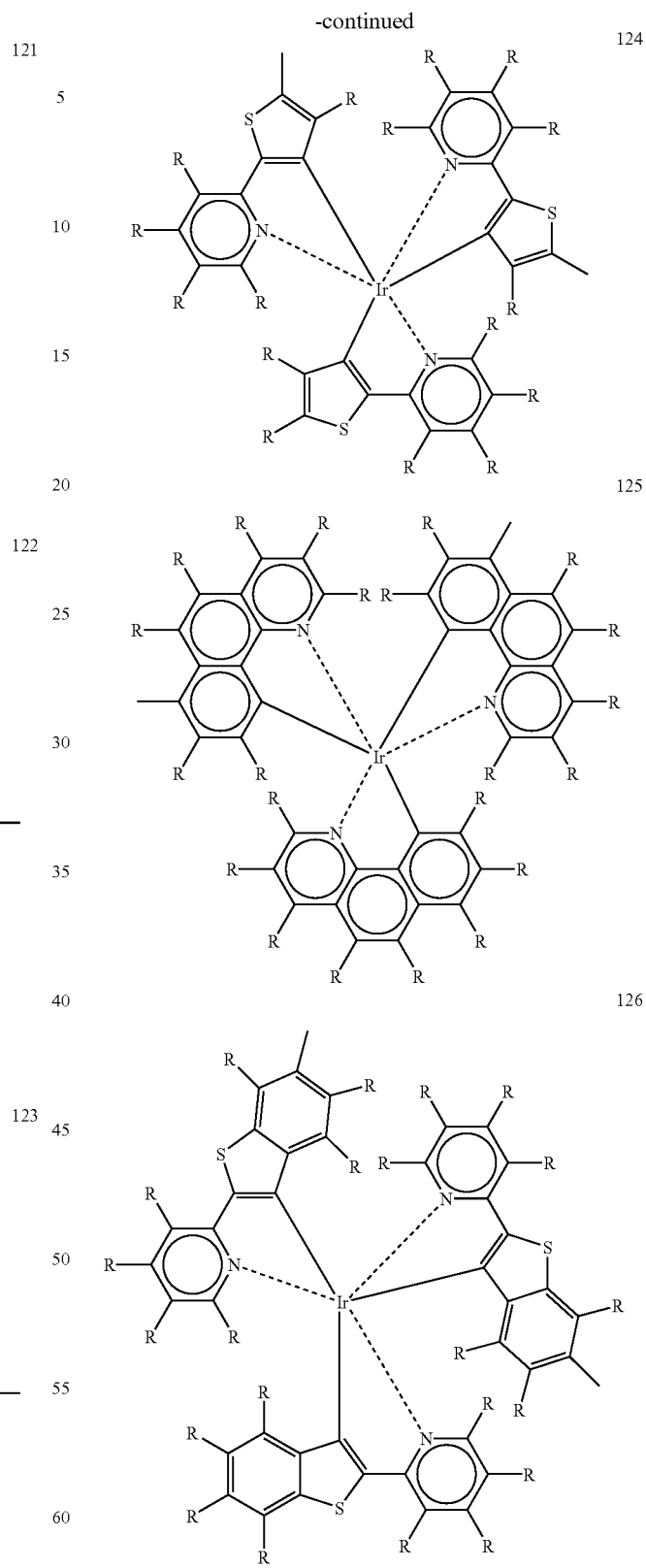
Here, R means the same with the R of the divalent groups described above as the examples of $Ar_1$. Examples and preferable examples thereof also include the same with those of $Ar_1$.

In formula (8), m is 0 or 1. $R_{36}$ and $R_{37}$ in formula (8) show each independently a group selected from a hydrogen atom, an alkyl group, an aryl group, a monovalent heterocyclic compound group, and cyano group.

Examples and preferable examples of $R_{36}$ and $R_{37}$ are the same with those exemplified in the example of $R_1$ and $R_2$ described above.

The total amount of repeating units represented by the formulae (1) and (8) is usually 50 mol % or more based on the total amount of all repeating units, and preferably 70 mol % or more. And the amount of repeating unit represented by the formula (1) is usually 0.1 mol % or more and 95 mol % or less based on the total amount of the repeating units represented by the formulae (1) and (8), more preferably 5 mol % or more and 95 mol % or less, and further preferably 7 mol % or more and 80 mol % or less.

Furthermore, in order to obtain a polymeric fluorescent substance having excellent luminescence characteristics and solubility, it is suitable that $Ar_1$ of formula (1) has one or more groups as the substituents selected from an aryl group and a monovalent heterocyclic compound group.

Examples of the suitable combinations of formulae (1) and (8) for obtaining excellent polymeric fluorescent substances include: a polymeric fluorescent substance in which $Ar_1$ in formula (1) is represented by the below formula (1'); a polymeric fluorescent substance in which $Ar_2$ in formula (8) is represented by the below formula (2'); and a polymeric fluorescent substance in which $Ar_1$ in formula (1) is represented by formula (1') and $Ar_2$ in formula (8) is represented by formula (2').

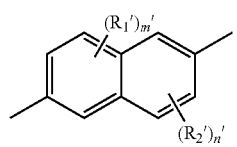

(1')

In the formula, $R_1'$ and $R2'$ represent each independently a group selected from alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, arylalkenyl group, arylalkynyl group, monovalent heterocyclic compound group, and cyano group; m' and n' are integers of 0-3 each independently; However, m' and n' are not 0 simultaneously; when m' is two or more, two or more $R_1'$ may be the same or different; when n' is two or more, plurality of $R_2'$ may be the same or different; moreover, $R_1'$ and $R_2'$ may be connected to form a ring; furthermore, when $R_1'$ and $R_2'$ contain an alkyl chain, said alkyl chain may be interrupted by a group containing a hetero atom.

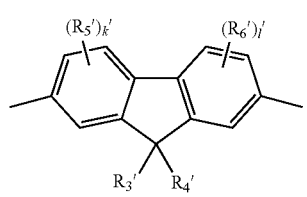

(2')

In the formula, $R_3'$ and $R_4'$ represent independently a group selected from a hydrogen atom, alkyl group, aryl group, and a heterocyclic compound group; $R_5'$ and $R_6'$ show each independently a group selected from alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, arylalkenyl group, arylalkynyl group, monovalent heterocyclic compound group, and cyano group; k' and l' are integers of 0-3 each independently; when k' is two or more, plurality of $R_5'$ may be the same or different; when l' is two or more, plurality of $R_6'$ may be the same or different; $R_3'$-$R_6'$ may be connected to form a ring; furthermore, in the case of the group in which $R_3'$-$R_6'$ contains an alkyl chain, this alkyl chain may be interrupted by a group containing a hetero atom.

When $Ar_1$ is represented by formula (1') and $Ar_2$ is represented by formula (2'), it is preferable that the total amount of repeating units represented by the formulae (1) and (8) is 50 mol % or more based on the total amount of all repeating units. And the amount of repeating unit represented by the formula (1) is preferably 0.1 mol % or more and 50 mol % or less based on the total amount of the repeating units represented by the formulae (1) and (8).

Further, a protecting group may be used to stabilize the terminal group of a polymeric fluorescent substance in accordance with the present invention since if an active polymerizable group remains intact, there is a possibility of reduction of the light emitting property and life of the polymeric fluorescent substance when the material is used in a device.

Protecting groups having a conjugated bond continued to the conjugated structure of the main chain are preferable, and examples thereof include structures containing a bond to an aryl group or a heterocyclic compound group via a vinylene group. Specifically, protecting groups described in JP-A No. 9-45478, chemical formula 10, and the like are exemplified.

This polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Further, copolymers may have a branched main chain and have three of more terminals. Dendrimers are also included.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

The polymeric fluorescent substance has a polystyrene-reduced number-average molecular weight of $10^3$ to $10^8$, and the degree of polymerization thereof also changes depending on repeating structures and proportion thereof. From the standpoint of film forming property, generally the total amount of repeating structures is preferably from 20 to 10000, more preferably from 30 to 10000, particularly preferably from 50 to 5000.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

As methods described in JP-A No. 5-202355, may for example, be utilized when the main chain has a vinylene group. Namely, exemplified are: a polymerization of a dialdehyde compound with a diphosphonium salt compound according to the Wittig reaction; a polymerizaiton of a divinyl compound with a dihalogen compound or of a vinyl halogen compound alone according to the Heck reaction; a polymerization of a dialdehyde compound with a diphosphate compound according to the Horner-Wadsworth-Emmons method; a polycondensation according to the de-hydrohalogenation method of a compound having two methyl halide groups; a polycondensation according to the sulfonium salt decomposing method of a compound having two sulfonium salt groups; a polymerization of a dialdehyde compound with a diacetonitrile compound according to the Knoevenagel reaction; and a polymerization of dialdehade compounds according to the McMurry reaction.

When a vinylene group is not contained in the main chain, there are exemplified a method in which polymerization is effected according to a Suzuki coupling reaction from the corresponding monomer, a method in which polymerization is effected according to a Grignard reaction, a method in which polymerization is effected using a Ni(0) catalyst, a method in which polymerization is effected using an oxidizing agent such as $FeCl_3$ and the like, a method of effecting oxidation polymerization electrochemically, a method according to decomposition of an intermediate polymer having a suitable releasing group, and the like. Of them, the method of effecting polymerization according to a Suzuki coupling reaction, the method of effecting polymerization according to a Grignard reaction, the method of effecting polymerization using a Ni(0) catalyst are preferable since reaction control is easy.

The polymeric fluorescent substance may contain a repeating unit other than repeating units represented by the formula (1) or (8), in an amount which does not deteriorate fluorescent property and charge carrying property. Further, repeating units represented by the formula (1) or (8) and other repeating units may be connected with a non-conjugation unit, or such a non-conjugation part may be contained in the repeating unit. As the bonding structure, there are exemplified those illustrated below, those obtained by combining those illustrated below with a vinylene group, those obtained by combining two or more of those illustrated below, and the like. Here, R represents a group selected from the above described groups, and Ar represents a hydrocarbon group having 6 to 60 carbon atoms.

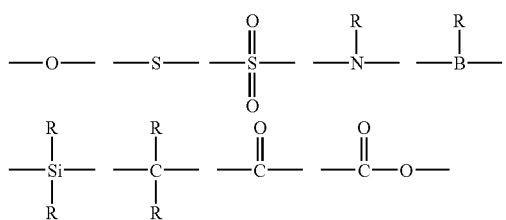

-continued

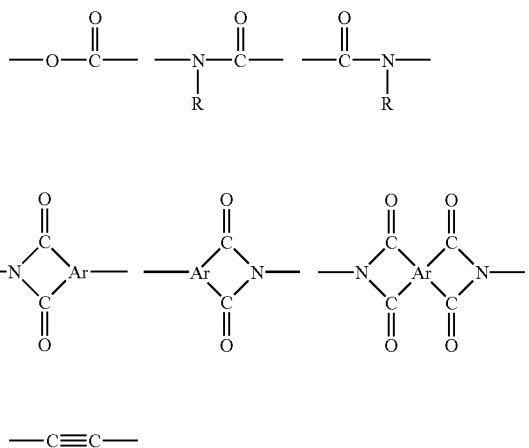

As the divalent repeating unit, aromatic amine groups having nitrogen atom bonding are exemplified. They are atomic groups in which two hydrogen atoms are removed from an aromatic amine, and have usually about 4 to 60 carbon atoms. Here, the number of carbon atoms of the substituent is not counted as the number of carbon atoms of the divalent group. Examples thereof include specifically the following groups (represented by the following structures of Nos. 127 to 130).

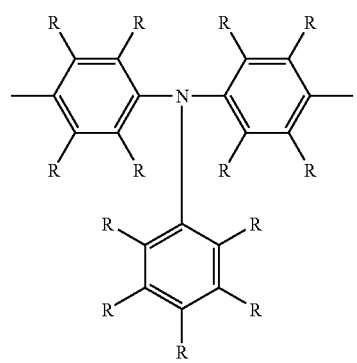

127

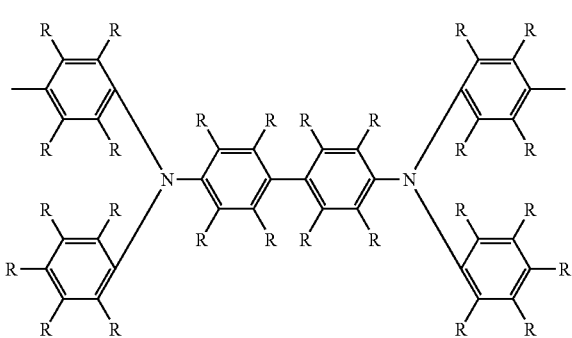

128

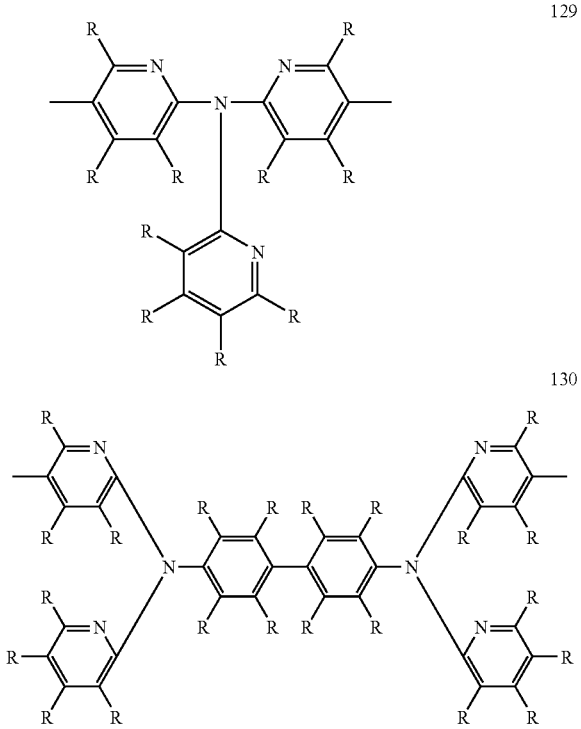

The polymeric fluorescent substance may also be a random, block or graft copolymer, or a polymer having an intermediate structure thereof, for example, a random copolymer having blocking property. From the viewpoint for obtaining a polymeric fluorescent substance having high fluorescent quantum yield, random copolymers having blocking property and block or graft copolymers are more preferable than complete random copolymers. Further, copolymers may have branched main chain and three or more terminals. Dendrimers are also included.

Further, as the polymeric fluorescent substance, those emitting fluorescence in a solid state are suitably used, since the material utilizes light emission from a thin film.

As good solvents for the polymeric fluorescent substance, there are exemplified chloroform, methylene chloride, dichloroethane, tetrahydrofuran, toluene, xylene, mesitylene, tetralin, decalin, n-butylbenzene and the like. The polymeric fluorescent substance can be usually dissolved in these solvents in an amount of 0.1 wt % or more, though the amount differs depending on the structure and molecular weight of the polymeric fluorescent substance.

When these polymeric fluorescent substances are used as a light emitting material of a polymer LED, the purity thereof exerts an influence on light emitting property, therefore, it is preferable that a monomer before polymerization is purified by a method such as distillation, sublimation purification, re-crystallization and the like before being polymerized and further, it is preferable to conduct a purification treatment such as re-precipitation purification, chromatographic separation and the like after the synthesis.

Next, the polymer LED of the present invention will be illustrated. The polymer LED of the present invention is a polymer LED comprising at least a light emitting layer between a pair of electrodes composed of an anode and a cathode at least one of which is transparent or semi-transparent wherein the light emitting layer contains a polymeric fluorescent substance of the present invention.

As the polymer LED of the present invention, there are listed polymer LEDs having an electron transporting layer disposed between a cathode and a light emitting layer, polymer LEDs having a hole transporting layer disposed between an anode and a light emitting layer, polymer LEDs having an electron transporting layer disposed between a cathode and a light emitting layer and having a hole transporting layer disposed between an anode and a light emitting layer.

For example, the following structures a) to d) are specifically exemplified.

a) anode/light emitting layer/cathode
b) anode/hole transporting layer/light emitting layer/cathode
c) anode/light emitting layer/electron transporting layer/cathode
d) anode/hole transporting layer/light emitting layer/electron transporting layer/cathode (wherein, / indicates adjacent lamination of layers. Hereinafter, the same)

Herein, the light emitting layer is a layer having function to emit a light, the hole transporting layer is a layer having function to transport a hole, and the electron transporting layer is a layer having function to transport an electron. Herein, the electron transporting layer and the hole transporting layer are generically called a charge transporting layer.

The light emitting layer, hole transporting layer and electron transporting layer may also each independently used in two or more layers.

Of charge transporting layers disposed adjacent to an electrode, that having function to improve charge injecting efficiency from the electrode and having effect to decrease driving voltage of an device are particularly called sometimes a charge injecting layer (hole injecting layer, electron injecting layer) in general.

For enhancing adherence with an electrode and improving charge injection from an electrode, the above-described charge injecting layer or insulation layer having a thickness of 2 nm or less may also be provided adjacent to an electrode, and further, for enhancing adherence of the interface, preventing mixing and the like, a thin buffer layer may also be inserted into the interface of a charge transporting layer and light emitting layer.

The order and number of layers laminated and the thickness of each layer can be appropriately applied while considering light emitting efficiency and life of the device.

In the present invention, as the polymer LED having a charge injecting layer (electron injecting layer, hole injecting layer) provided, there are listed a polymer LED having a charge injecting layer provided adjacent to a cathode and a polymer LED having a charge injecting layer provided adjacent to an anode.

For example, the following structures e) to p) are specifically exemplified.

e) anode/charge injecting layer/light emitting layer/cathode
f) anode/light emitting layer/charge injecting layer/cathode
g) anode/charge injecting layer/light emitting layer/charge injecting layer/cathode
h) anode/charge injecting layer/hole transporting layer/light emitting layer/cathode
i) anode/hole transporting layer/light emitting layer/charge injecting layer/cathode j) anode/charge injecting layer/hole transporting layer/light emitting layer/charge injecting layer/cathode k) anode/charge injecting layer/light emitting layer/electron transporting layer/cathode l) anode/light emitting layer/electron transporting layer/charge injecting layer/cathode m) anode/charge injecting layer/light emitting layer/electron transporting layer/charge injecting layer/cathode n) anode/charge injecting layer/hole transporting layer/light emitting layer/electron transporting layer/cathode o) anode/hole transporting layer/light emitting layer/electron transporting layer/charge injecting layer/cathode p) anode/charge injecting layer/hole transporting layer/light emitting layer/electron transporting layer/charge injecting layer/cathode As the specific examples of the charge injecting layer, there are exemplified layers containing an conducting polymer, layers which are disposed between an anode and a hole transporting layer and contain a material having an ionization potential between the ionization potential of an anode material and the ionization potential of a hole transporting material contained in the hole transporting layer, layers which are disposed between a cathode and an electron transporting layer and contain a material having an electron affinity between the electron affinity of a cathode material and the electron affinity of an electron transporting material contained in the electron transporting layer, and the like.

When the above-described charge injecting layer is a layer containing a conducting polymer, the electric conductivity of the conducting polymer is preferably $10^{-5}$ S/cm or more and $10^3$ S/cm or less, and for decreasing the leak current between light emitting pixels, more preferably $10^{-5}$ S/cm or more and $10^2$ S/cm or less, further preferably $10^{-5}$ S/cm or more and $10^1$ S/cm or less.

Usually, to provide an electric conductivity of the conducting polymer of $10^{-5}$ S/cm or more and $10^3$ S/cm or less, a suitable amount of ions are doped into the conducting polymer.

Regarding the kind of an ion doped, an anion is used in a hole injecting layer and a cation is used in an electron injecting layer. As examples of the anion, a polystyrene sulfonate ion, alkylbenzene sulfonate ion, camphor sulfonate ion and the like are exemplified, and as examples of the cation, a lithium ion, sodium ion, potassium ion, tetrabutyl ammonium ion and the like are exemplified.

The thickness of the charge injecting layer is for example, from 1 nm to 100 nm, preferably from 2 nm to 50 nm.

Materials used in the charge injecting layer may properly be selected in view of relation with the materials of electrode and adjacent layers, and there are exemplified conducting polymers such as polyaniline and derivatives thereof, polythiophene and derivatives thereof, polypyrrole and derivatives thereof, poly(phenylene vinylene) and derivatives thereof, poly(thienylene vinylene) and derivatives thereof, polyquinoline and derivatives thereof, polyquinoxaline and derivatives thereof, polymers containing aromatic amine structures in the main chain or the side chain, and the like, and metal phthalocyanine (copper phthalocyanine and the like), carbon and the like.

The insulation layer having a thickness of 2 nm or less has function to make charge injection easy. As the material of the above-described insulation layer, metal fluoride, metal oxide, organic insulation materials and the like are listed. As the polymer LED having an insulation layer having a thickness of 2 nm or less, there are listed polymer LEDs having an insulation layer having a thickness of 2 nm or less provided adjacent to a cathode, and polymer LEDs having an insulation layer having a thickness of 2 nm or less provided adjacent to an anode.

Specifically, there are listed the following structures q) to ab) for example.

q) anode/insulation layer having a thickness of 2 nm or less/light emitting layer/cathode r) anode/light emitting layer/insulation layer having a thickness of 2 nm or less/cathode s) anode/insulation layer having a thickness of 2 nm or less/light emitting layer/insulation layer having a thickness of 2 nm or less/cathode t) anode/insulation layer having a thickness of 2 nm or less/hole transporting layer/light emitting layer/cathode u) anode/hole transporting layer/light emitting layer/insulation layer having a thickness of 2 nm or less/cathode v) anode/insulation layer having a thickness of 2 nm or less/hole transporting layer/light emitting layer/insulation layer having a thickness of 2 nm or less/cathode w) anode/insulation layer having a thickness of 2 nm or less/light emitting layer/electron transporting layer/cathode x) anode/light emitting layer/electron transporting layer/insulation layer having a thickness of 2 nm or less/cathode y) anode/insulation layer having a thickness of 2 nm or less/light emitting layer/electron transporting layer/insulation layer having a thickness of 2 nm or less/cathode z) anode/insulation layer having a thickness of 2 nm or less/hole transporting layer/light emitting layer/electron transporting layer/cathode aa) anode/hole transporting layer/light emitting layer/electron transporting layer/insulation layer having a thickness of 2 nm or less/cathode ab) anode/insulation layer having a thickness of 2 nm or less/hole transporting layer/light emitting layer/electron transporting layer/insulation layer having a thickness of 2 nm or less/cathode In producing a polymer LED, when a film is formed from a solution by using such polymeric fluorescent substance soluble in an organic solvent, only required is removal of the solvent by drying after coating of this solution, and even in the case of mixing of a charge transporting material and a light emitting material, the same method can be applied, causing an extreme advantage in production. As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

Regarding the thickness of the light emitting layer, the optimum value differs depending on material used, and may properly be selected so that the driving voltage and the light emitting efficiency become optimum values, and for example, it is from 1 nm to 1 µm, preferably from 2 nm to 500 nm, further preferably from 5 nm to 200 nm.

In the polymer LED of the present invention, a light emitting material other than the above-mentioned polymeric fluorescent substances may be mixed in a light emitting layer. Further, in the polymer LED according to the instant application, a light emitting layer containing a light emitting material other than the above-mentioned polymeric fluorescent substance may be laminated with a light emitting layer containing the above-mentioned polymeric fluorescent substance.

As the light emitting material, known materials can be used. In a compound having lower molecular weight, there can be used, for example, naphthalene derivatives, anthracene or derivatives thereof, perylene or derivatives thereof; dyes such as polymethine dyes, xanthene dyes, coumarine dyes, cyanine dyes; metal complexes of 8-hydroxyquinoline or derivatives thereof, aromatic amine, tetraphenylcyclopentane or derivatives thereof, or tetraphenylbutadiene or derivatives thereof, and the like.

Specifically, there can be used known compounds such as those described in JP-A Nos. 57-51781, 59-195393 and the like, for example.

When the polymer LED of the present invention has a hole transporting layer, as the hole transporting materials used, there are exemplified polyvinylcarbazole or derivatives thereof, polysilane or derivatives thereof, polysiloxane derivatives having an aromatic amine in the side chain or the main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, or the like.

Specific examples of the hole transporting material include those described in JP-A Nos. 63-70257, 63-175860, 2-135359, 2-135361, 2-209988, 3-37992 and 3-152184.

Among them, as the hole transporting materials used in the hole transporting layer, preferable are polymer hole transporting materials such as polyvinylcarbazole or derivatives thereof, polysilane or derivatives thereof, polysiloxane derivatives having an aromatic amine compound group in the side chain or the main chain, polyaniline or derivatives thereof, polythiophene or derivatives thereof, poly(p-phenylenevinylene) or derivatives thereof, poly(2,5-thienylenevinylene) or derivatives thereof, or the like, and further preferable are polyvinylcarbazole or derivatives thereof, polysilane or derivatives thereof and polysiloxane derivatives having an aromatic amine compound group in the side chain or the main chain. In the case of a hole transporting material having lower molecular weight, it is preferably dispersed in a polymer binder for use.

Polyvinylcarbazole or derivatives thereof are obtained, for example, by cation polymerization or radical polymerization from a vinyl monomer.

As the polysilane or derivatives thereof, there are exemplified compounds described in Chem. Rev., 89, 1359 (1989) and GB 2300196 published specification, and the like. For synthesis, methods described in them can be used, and a Kipping method can be suitably used particularly.

As the polysiloxane or derivatives thereof, those having the structure of the above-described hole transporting material having lower molecular weight in the side chain or main chain are used, since the siloxane skeleton structure has poor hole transporting property. Particularly, there are exemplified those having an aromatic amine having hole transporting property in the side chain or main chain.

The method for forming a hole transporting layer is not restricted, and in the case of a hole transporting layer having lower molecular weight, a method in which the layer is formed from a mixed solution with a polymer binder is exemplified. In the case of a polymer hole transporting material, a method in which the layer is formed from a solution is exemplified.

The solvent used for the film forming from a solution is not particularly restricted providing it can dissolve a hole transporting material. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film forming method from a solution, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like, from a solution.

The polymer binder mixed is preferably a binder that does not disturb charge transport extremely, and a binder that does not have strong absorption of a visible light is suitably used. As such polymer binder, polycarbonate, polyacrylate, poly(methyl acrylate), poly(methyl methacrylate), polystyrene, poly(vinyl chloride), polysiloxane and the like are exemplified.

Regarding the thickness of the hole transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the hole transporting layer is, for example, from 1 nm to 1 µm, preferably from 2 nm to 500 nm, further preferably from 5 nm to 200 nm.

When the polymer LED of the present invention has an electron transporting layer, known compounds are used as the electron transporting materials, and there are exemplified oxadiazole derivatives, anthraquinonedimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or metal complexes of 8-hydroxyquinoline or derivatives thereof, polyquinoline and derivatives thereof, polyquinoxaline and derivatives thereof, polyfluorene or derivatives thereof, and the like.

Specifically, there are exemplified those described in JP-A Nos. 63-70257, 63-175860, 2-135359, 2-135361, 2-209988, 3-37992 and 3-152184.

Among them, oxadiazole derivatives, benzoquinone or derivatives thereof, anthraquinone or derivatives thereof, or metal complexes of 8-hydroxyquinoline or derivatives thereof, polyquinoline and derivatives thereof, polyquinoxaline and derivatives thereof, polyfluorene or derivatives thereof are preferable, and 2-(4-biphenyl)-5-(4-t-butylphenyl)-1,3,4-oxadiazole, benzoquinone, anthraquinone, tris(8-quinolinol)aluminum and polyquinoline are further preferable.

The method for forming the electron transporting layer is not particularly restricted, and in the case of an electron transporting material having lower molecular weight, a vapor deposition method from a powder, or a method of film-forming from a solution or melted state is exemplified, and in the case of a polymer electron transporting material, a method of film-forming from a solution or melted state is exemplified, respectively. When film-forming is conducted from a solution or melted state, a polymer binder may be used together.

The solvent used in the film-forming from a solution is not particularly restricted provided it can dissolve electron transporting materials and/or polymer binders. As the solvent, there are exemplified chlorine solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film-forming method from a solution or melted state, there can be used coating methods such as a spin coating method, casting method, micro gravure coating method, gravure coating method, bar coating method, roll coating method, wire bar coating method, dip coating method, spray coating method, screen printing method, flexo printing method, offset printing method, inkjet printing method and the like.

The polymer binder to be mixed is preferably a binder which does not extremely disturb a charge transport property, and a binder that does not have strong absorption of a visible light is suitably used. As such polymer binder, poly(N-vinylcarbazole), polyaniline or derivatives thereof, polythiophene or derivatives thereof, poly(p-phenylenevinylene) or derivatives thereof, poly(2,5-thienylenevinylene) or derivatives thereof, polycarbonate, polyacrylate, poly(methyl acrylate), poly(methylmethacrylate), polystyrene, poly(vinyl chloride), polysiloxane and the like are exemplified.

Regarding the thickness of the electron transporting layer, the optimum value differs depending on material used, and may properly be selected so that the driving voltage and the light emitting efficiency become optimum values, and at least a thickness at which no pin hole is produced is necessary, and too large thickness is not preferable since the driving voltage of the device increases. Therefore, the thickness of the electron transporting layer is, for example, from 1 nm to 1 μm, preferably from 2 nm to 500 nm, further preferably from 5 nm to 200 nm.

The substrate forming the polymer LED of the present invention may preferably be one that does not change in forming an electrode and layers of organic materials, and there are exemplified glass, plastics, polymer film, silicon substrates and the like. In the case of a opaque substrate, it is preferable that the opposite electrode is transparent or semitransparent.

In the present invention, it is preferable that an anode is transparent or semitransparent, and as the material of this anode, electron conductive metal oxide films, semitransparent metal thin films and the like are used. Specifically, there are used indium oxide, zinc oxide, tin oxide, and films (NESA and the like) fabricated by using an electron conductive glass composed of indium-tin-oxide (ITO), indium.zinc.oxide and the like, which are metal oxide complexes, and gold, platinum, silver, copper and the like are used, and among them, ITO, indium.zinc.oxide, tin oxide are preferable. As the fabricating method, a vacuum vapor deposition method, sputtering method, ion plating method, plating method and the like are used. As the anode, there may also be used organic transparent conducting films such as polyaniline or derivatives thereof, polythiophene or derivatives thereof and the like.

The thickness of the anode can be appropriately selected while considering transmission of a light and electric conductivity, and for example, from 10 nm to 10 μm, preferably from 20 nm to 1 μm, further preferably from 50 nm to 500 nm.

Further, for easy charge injection, there may be provided on the anode a layer comprising a phthalocyanine derivative, conducting polymers, carbon and the like, or a layer having an average film thickness of 2 nm or less comprising a metal oxide, metal fluoride, organic insulating material and the like.

As the material of a cathode used in the polymer LED of the present invention, that having lower work function is preferable. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, or alloys comprising two or more of them, or alloys comprising one or more of them with one or more of gold, silver, platinum, copper, manganese, titanium, cobalt, nickel, tungsten and tin, graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The film thickness of a cathode can be appropriately selected in view of electric conductivity and durability, and for example, it is from 10 nm to 10 μm, preferably from 20 nm to 1 μm, further preferably from 50 nm to 500 nm.

As the method for fabricating a cathode, there are used a vacuum vapor deposition method, sputtering method, lamination method in which a metal thin film is adhered under heat and pressure, and the like. Further, there may also be provided, between a cathode and an organic layer, a layer comprising a conducting polymer, or a layer having an average film thickness of 2 nm or less comprising a metal oxide, metal fluoride, organic insulation material and the like, and after fabrication of the cathode, a protective layer may also be provided which protects the polymer LED. For stable use of the polymer LED for a long period of time, it is preferable to provide a protective layer and/or protective cover for protection of the device in order to prevent it from outside damage.

As the protective layer, there can be used a polymer compound, metal oxide, metal fluoride, metal borate and the like. As the protective cover, there can be used a glass plate, a plastic plate the surface of which has been subjected to lower-water-permeation treatment, and the like, and there is suitably used a method in which the cover is pasted with an device substrate by a thermosetting resin or light-curing resin for sealing. If space is maintained using a spacer, it is easy to prevent a device from being injured. If an inner gas such as nitrogen and argon is sealed in this space, it is possible to prevent oxidation of a cathode, and further, by placing a desiccant such as barium oxide and the like in the above-described space, it is easy to suppress the damage of a device by moisture adhered in the production process. Among them, any one means or more are preferably adopted.

For obtaining light emission in plane form using the polymer LED of the present invention, an anode and a cathode in the plane form may properly be placed so that they are laminated on each other. Further, for obtaining light emission in pattern form, there are a method in which a mask with a window in pattern form is placed on the above-described plane light emitting device, a method in which an organic layer in non-light emission part is formed to obtain extremely large thickness providing substantial non-light emission, and a method in which any one of an anode or a cathode, or both of them are formed in the pattern. By forming a pattern by any of these methods and by placing some electrodes so that independent on/off is possible, there is obtained a display device of segment type which can display digits, letters, simple marks and the like. Further, for forming a dot matrix device, it may be advantageous that anodes and cathodes are made in the form of stripes and placed so that they cross at right angles. By a method in which a plurality of kinds of polymeric fluorescent substances emitting different colors of lights are placed separately or a method in which a color filter or luminescence converting filter is used, area color displays and multi color displays are obtained. A dot matrix display can be driven by passive driving, or by active driving combined with TFT and the like. These display devices can be used as a display of a computer, television, portable terminal, portable telephone, car navigation, view finder of a video camera, and the like.

Further, the above-described light emitting device in plane form is a thin self-light-emitting one, and can be suitably used as a flat light source for back-light of a liquid crystal display, or as a flat light source for illumination. Further, if a flexible plate is used, it can also be used as a curved light source or a display.

EXAMPLES

The following examples further illustrate the present invention in detail but do not limit the scope thereof.

Herein, regarding the number average molecular weight, a polystyrene reduced number-average molecular weight was measured by gel permeation chromatography (GPC) using chloroform as a solvent.

Example 1

Synthesis of 2,6-dibromo-1,5-dihexyloxynaphthalene

Under an inert atmosphere, sodium ethoxide (2.76 g, 40.6 mmol) and 2,6-dibromo-1,5-di hydroxynaphthalene (5 g, 15.7 mmol) were dissolved in ethanol (60 ml). Under reflux, ethanol solution (10 ml) of hexylbromide (6.7 g, 40.6 mmol) was added dropwise in 10 minutes. It was refluxed for 5 hours and then left for cooling. The reaction mixture was added to 1N sodium-hydroxide aqueous solution, and the depositing precipitate was filtrated. The precipitate was washed with methylene chloride, and the washed solution was concentrated under a reduced pressure to obtain a crude product. The desired product was obtained after purifying by silica gel chromatography (toluene:hexane=4:1).

The amount was 3.72 g, and the yield was 48%.

Synthesis of 9,9-dioctylfluorene-2,7-bis(ethylene boronate)

2,7-di bromo fluorene (25 g, 77 mmol), octylbromide (44.7 g, 0.596 mols), sodium hydroxide (37.5 g, 0.937 mols), and tetrabutyl ammonium bromide (0.5 g, 1.55 mmol) were dissolved in dimethyl sulfoxide (75 ml)-water (37.5 ml) mixed solvent. It was kept warm at 80° C. for 6 hours. After cooling, toluene (100 ml) and water (100 ml) were added, and the organic layer was partitioned. The organic layer is washed with water, 3% hydrochloric acid, and water, and then dehydrated with anhydrous sodium sulfate. The solvent was distilled off under reduced pressure and the crude product was purified by silica-gel chromatography, and 2,7-dibromo-9,9-dioctylfluorene was obtained. (Amount: 26.85 g, yield: 79%)

The resulting 2,7-dibromo-9,9-dioctylfluorene (24.7 g, 22.8 mmol) was dissolved in tetrahydrofuran under an inert atmosphere, and cooled to −70° C. or less. To this, 1.6M of n-butyllithium (61.9 ml) was added dropwise in 40 minutes. After 2 hours stirring, trimethoxyborane (14.0 g, 135 mmol) was added dropwise in 5 minutes. After raising the temperature to a room temperature, the mixture was added into 5% sulfuric acid, and the organic layer was partitioned. The aqueous layer was extracted with ethylacetate, and the organic layer was collected and washed with water. The organic layer was dried by molecular sieves and the solvent was distilled off under reduced pressure. The residue was suspended in hexane, filtrated off the insoluble material, and a crude product of 9,9-dioctylfluorene-2,7-di-boronic acid was obtained (12.56 g, 26.3 mmol).

The crude product was dissolved in 630 ml of toluene together with ethylene glycol (33.85 g, 0.545 mols). 500 ml of the toluene was distilled off at 115° C., and the same amount of toluene was added. The distillation-addition was conducted repeatedly two times, left for cooling, and then the organic layer was washed with water, and dehydrated with anhydrous sodium sulfate. The solvent was distill off under reduced pressure and the crude product was purified by silica-gel chromatography (toluene:ethylacetate=5:1), and 9,9-dioctylfluorene-2,7-bis(ethylene boronate) was obtained. The amount was 6.65 g, and the yield was 54%.

Synthesis of poly(9,9-dioctylfluorene-1,5-dihexyloxy-2,6-naphthalene)

Under an inert atmosphere, 9,9-dioctylfluorene-2,7-bis (ethyleneboronate) (305 mg, 0.574 mmol), 2,6-dibromo-1,5-dihexyloxynaphthalene (266 mg, 0.549 mmol) and aliquat® 336 (tricaprylylmethylammonium chloride, manufactured by Aldrich, 200 mg, 0.497 mmol) were dissolved in toluene (10 ml) and to this was added 10 ml of an aqueous solution of potassium carbonate (225 mg, 1.49 mmol). Further, tetrakis (triphenylphosphine)palladium (19 mg, 0.015 mmol) was added, and the mixture was heated under reflux for 20 hours. After cooling, the solution was separated, and the organic layer was washed with water. This organic layer was dropped into methanol, and the deposited precipitate was filtrated off to obtain Polymeric fluorescent substance 1'. The yield was 190 mg. By NMR, it was confirmed that the obtained polymer has a following repeating unit expected from the charged monomer.

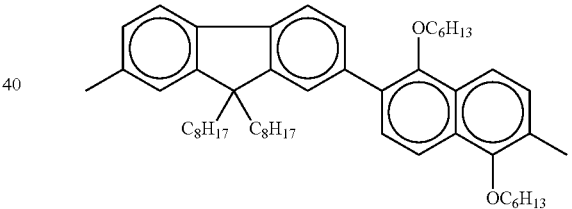

Polymeric fluorescent substance 1' had a polystyrene-reduced number-average molecular weight of $1.9 \times 10^4$. Polymeric fluorescent substance 1 could be dissolved in a solvent such as toluene, chloroform and the like.

<Evaluation of Fluorescent Property>

A 0.4 wt % chloroform solution of Polymeric fluorescent substance 1 was spin-coated on quartz, to form a thin film of Polymeric fluorescent substance 1'. The ultraviolet visible absorption spectrum and fluorescent spectrum of this thin film were measured by using a ultraviolet visible absorption spectrophotometer (UV3500 manufactured by Hitachi, Ltd.) and a fluorescent spectrophotometer (850 manufactured by Hitachi, Ltd.), respectively. For calculation of fluorescent strength, a fluorescent spectrum excited at 350 nm was used. The area of fluorescent spectra plotted against wave-number on the abscissa was divided by the absorption at 350 nm, to obtain a relative value of the fluorescent strength.

Polymeric fluorescent substance 1' has a fluorescent peak wave-length of 484 nm, and revealed a relative value of the fluorescent strength of 2.0.

<Production and Evaluation of the Device>

On a glass substrate on which an ITO film had been made at a thickness of 150 nm according to a sputtering method, a film having a thickness of 50 nm was formed using a solution (Baytron, manufactured by Bayer) of poly(ethylenedioxythiophene)/polystyrenesulfonic acid by spin coating, and the film was dried at 120° C. for 10 minutes on a hot plate. Then, a film having a thickness of about 70 nm was formed using a 1.5 wt % toluene solution of Polymeric fluorescent substance 1' by spin coating. Further, this film was dried at 80° C. for 1 hour under reduced pressure, then, lithium fluoride was vapor-deposited at 0.4 nm as a cathode buffer layer, calcium was vapor-deposited at 25 nm and aluminum was vapor-deposited at 40 nm as a cathode, to produce a polymer LED. In any vapor deposition, the degree of vacuum was 1 to $8\times10^{-6}$ Torr. Voltage was applied on the resulted device, to give EL light emission from Polymeric fluorescent substance 1'. The strength of EL light emission was approximately in proportion to the current density. Maximum light emitting efficiency was about 1.4 cd/A.

Comparative Example 1

Synthesis of poly(9,9-dioctylfluorene-1,5-naphthalene)

Under an inert atmosphere, 9,9-dioctylfluorene-2,7-bis (ethylene boronate) (305 mg, 0.574 mmol), 2,6-dibromonaphthalene (142 mg, 0.549 mmol) and aliquat® 336 (tricaprylylmethylammonium chloride, manufactured by Aldrich, 200 mg, 0.497 mmol) were dissolved in toluene (10 ml) and to this was added 10 ml of an aqueous solution of potassium carbonate (225 mg, 1.49 mmol). Further, tetrakis (triphenylphosphine) palladium (19 mg, 0.015 mmol) was added, and the mixture was heated under reflux for 20 hours. After cooling, the solution was separated, and the organic layer was washed with water. This organic layer was dropped into methanol, and the deposited precipitate was filtrated off to obtain Polymeric fluorescent substance 2'. The yield was 99 mg. By NMR, it was confirmed that the obtained polymer has a following repeating unit expected from the charged monomer.

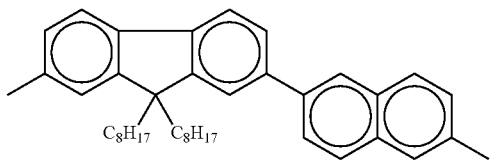

Polymeric fluorescent substance 2' had a polystyrene-reduced number-average molecular weight of $2.0\times10^4$. Polymeric fluorescent substance 2' could be dissolved in a solvent such as toluene, chloroform and the like.

<Evaluation of Fluorescent Property>

The relative value of the fluorescent strength of polymeric fluorescent substance 2' was obtained as the same manner with Example 1.

Polymeric fluorescent substance 2' has a fluorescent peak wave-length of 428 nm, and a relative value of the fluorescent strength of 0.42.

<Production and Evaluation of the Device>

A polymer LED was produced as the same manner with Example 1 except that polymeric fluorescent substance 2' was used instead of polymeric fluorescent substance 1'. Voltage was applied on the resulted device, to give EL light emission from Polymeric fluorescent substance 2'. The strength of EL light emission was approximately in proportion to the current density. Maximum light emitting efficiency was about 0.1 cd/A.

Example 2

Synthesis of poly(9,9-dioctylfluorene-co-1,5-dihexyloxy-2,6-naphthalene)

Under an inert atmosphere, 9,9-dioctylfluorene-2,7-bis (ethylene boronate) (305 mg, 0.574 mmol), 2,7-dibromo-9,9-dioctylnaphthalene (270 mg, 0.492 mmol), 2,6-dibromo-1,5-dihexyloxynaphthalene (26.6 mg, 0.0549 mmol), and aliquat® 336 (tricaprylylmethylammonium chloride, manufactured by Aldrich, 200 mg, 0.549 mmol) were dissolved in toluene (10 ml) and to this was added 10 ml of an aqueous solution of potassium carbonate (238 mg, 1.72 mmol). Further, tetrakis(triphenylphosphine)palladium (1.27 mg, 0.0011 mmol) was added, and the mixture was heated under reflux for 10 hours. After cooling, the solution was separated, and the organic layer was washed with water. This organic layer was dropped into methanol, and the deposited precipitate was filtrated off to obtain Polymeric fluorescent substance 3'. The yield was 280 mg. By NMR, it was confirmed that the obtained polymer has a following repeating unit expected from the charged monomer.

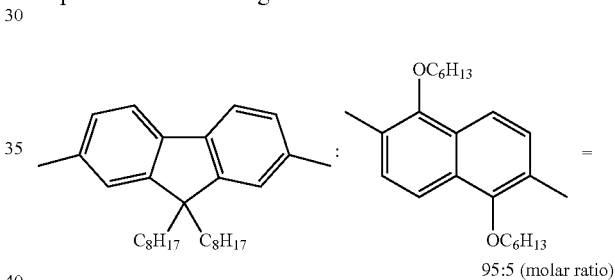

95:5 (molar ratio)

Polymeric fluorescent substance 3' had a polystyrene-reduced number-average molecular weight of $3.5\times10^4$. Polymeric fluorescent substance 3' could be dissolved in a solvent such as toluene, and chloroform.

<Evaluation of Fluorescent Property>

The relative value of the fluorescent strength of polymeric fluorescent substance 3' was obtained as the same manner with Example 1.

Polymeric fluorescent substance 3' has a fluorescent peak wave-length of 426 nm, and a relative value of the fluorescent strength of 4.98.

Referential Example 1

Synthesis of naphthalene-1,4-dicarboxylic acid diethyl ester 40.0 g of naphthalene-1,4-dicarboxylic acid, and 50 g of concentrated sulfuric acid were added to 415 ml of ethanol. After heating for 6 hours with ref lux, ethanol was distilled off. Extraction from the residue was carried out with toluene/water. The organic layer was washed with 3% aqueous solution of sodium bicarbonate, dried by sodium sulfate, concentrated with using an evaporator, and isolated by column chromatography (silica-gel/toluene:ethyl acetate). 37.8 g of naphthalene-1,4-dicarboxylic-acid diethyl ester was obtained as the desired product.

Referential Example 2

Synthesis of 6-bromonaphthalene-1,4-dicarboxylic-acid diethyl ester

Naphthalene-1,4-dicarboxylic-acid diethyl ester 35.0 g was dissolved in a mixed solvents 280 ml of methylene chloride and concentrated sulfuric acid (weight ratio 3:7), and N-bromo succinimide 22.9 g was added here at a room temperature. After stirring overnight, the reaction mixture was poured into ice, and extracted with ethyl acetate. The extracted solution was washed with diluted alkaline water, subsequently with water, and then dried by magnesium sulfate. The solution was concentrated, and treaded with column processing (silica gel/chloroform), and 28.0 g of a crude product of 6-bromonaphthalene-1,4-dicarboxylic-acid diethyl ester was obtained.

Referential Example 3

Synthesis of 6-(4-(3,7-dimethyloctyloxy)phenyl) naphthalene 1,4-dicarboxylic-acid diethyl ester Under argon atmosphere and in a toluene/water mixed solvent, 6-bromonaphthalene-1,4-dicarboxylic-acid diethyl ester 4.5 g and 4-(3,7-dimethyloctyloxy)phenyl boric acid 4.0 g were reacted with using tetrakis(triphenylphosphine)palladium under a condition of usual Suzuki reaction. Purification by column treatment (silica gel/toluene) was carried out, and 6-(4-(3,7-dimethyloctyloxy)phenyl)naphthalene-1,4-dicarboxylic-acid diethyl ester 3.5 g was obtained.

Referential Example 4

Synthesis of 1,4-bis(hydroxymethyl)-6-(4-(3,7-dimethyl octyloxy)phenyl)naphthalene Under argon atmosphere and with cooling in ice, 10.0 ml of THF solutions of $LiAlH_4$ (1.0M) was added to 6-(4-(3,7-dimethyloctyloxy)phenyl)naphthalene-1,4-dicarboxylic-acid diethyl ester 1.42 g in THF solution, and stirred at a temperature as it was, for 3 hours.
Purification by column treatment (silica gel/toluene:ethyl acetate) was carried out, and 1.48 g crude product of 1,4-bis (hydroxymethyl)-6-(4-(3,7-dimethyloctyloxy)phenyl)naphthalene was obtained.

Referential Example 5

Synthesis of 1,4-bis(chloromethyl)-6-(4'-(3,7-dimethyl octyloxy)phenyl)naphthalene Under nitrogen atmosphere, 1.40 g of a crude product of 1,4-bis(hydroxymethyl)-6-(4-(3,7-dimethyloctyloxy)phenyl)naphthalene was dispersed in chloroform, and 1.29 g of thionyl chloride was added dropwise at a room temperature, to result a complete solution system quickly.
Purification by column treatment (silica gel/toluene-hexane) was carried out, and 1,4-bis(chloromethyl)-6-(4'-(3,7-dimethyloctyloxy)phenyl)naphthalene 1.07 g was obtained.

$^1$H-NMR (200 MHz/CDCl$_3$)
ä 0.88 ppm (d, 6H)
0.96 ppm (d, 3H)
1.18-1.89 ppm (m, 10H)
4.06 ppm (t, 2H)
5.02 ppm (s, 2H)
5.05 Ppm (s, 2H)
7.04 ppm (d, 2H)
7.42 ppm (d, 1H)
7.47 ppm (D, 1H)
7.67 ppm (d, 2H)
7.86 ppm (dd, 1H)
8.21 ppm (d, 1H)
8.30 ppm (dd, 1H)

Referential Example 6

Synthesis of 1,4-bis(bromomethyl)-2-{4-(3,7-dimethyl octyloxy)phenyl}naphthalene 1,4-dimethyl-2-(4-(3,7-dimethyloctyloxy)phenyl)naphthalene was prepared in accordance with the case of 6-(4-(3, 7-dimethyloctyloxy)phenyl)naphthalene-1,4-dicarboxylicacid diethyl ester described above, but using 1,4-dimethyl-2-bromonaphthalene, as a raw material, which was obtained by brominating 1,4-dimethylnaphtalene with Br$_2$. 1,4-dimethyl-2-(4-(3,7-dimethyloctyloxy)phenyl)naphthalene was dissolved in carbon tetrachloride, and reacted to NBS to obtain 1,4-bis(bromomethyl)-2-{4-(3,7-dimethyloctyloxy) phenyl}naphthalene was obtained.

Referential Example 7

Synthesis of 2,6-bis(chloromethyl)-4-(4-(3,7-dimethyl octyloxy)phenyl)naphthalene This compound was prepared in accordance with the case of 1,4-bis(chloromethyl)-6-(4'-(3,7-dimethyloctyloxy)phenyl)naphthalene described above, with using naphthalene-2, 6-dicarboxylic acid as a raw material.

Example 3

Synthesis of Polymeric Fluorescent Substance 4

1,4-bis(chloromethyl)-6-{4'-(3,7-dimethyloctyloxy) phenyl}naphthalene 0.23 g and 2-methoxy-5-(2-ethylhexyloxy)-p-xylene dichloride 0.167 g were dissolved in 1,4-dioxane (dehydration) 135 ml, then by nitrogen gas bubbling, the atmosphere in the system was replaced with nitrogen gas. This solution was raised to 95° C. in nitrogen-gas atmosphere. Then, to this solution, a solution obtained by dissolving potassium tert-butoxide 0.52 g in 1,4-dioxane (dehydration) 15 ml and replacing the atmosphere with nitrogen gas by nitrogen gas bubbling, was added in about 10 minutes. Subsequently, it was reacted at 95° C. for 2.5 hours in nitrogen-gas atmosphere.
After cooling, this solution was neutralized with adding acetic acid. About 200 ml of methanol was added to the solution and resulting precipitate was collected. Next, this precipitate was washed with ethanol and dried under reduced pressure, then 0.17 g of a polymer was obtained.
Next, after dissolving the polymer in chloroform, reprecipitation purification was conducted by a method of methanol addition to this solution.

The resulting precipitate was washed by ethanol, then dried at reduced pressure and 0.16 g of a polymer was obtained. The resulting polymer is referred to as Polymeric fluorescent substance 4.

The polystyrene reduced number average molecular weight of polymeric fluorescent substance 4 was $3.3 \times 10^4$.

The polystyrene reduced number average molecular weight of polymeric fluorescent substance 5 was $1.4 \times 10^4$.

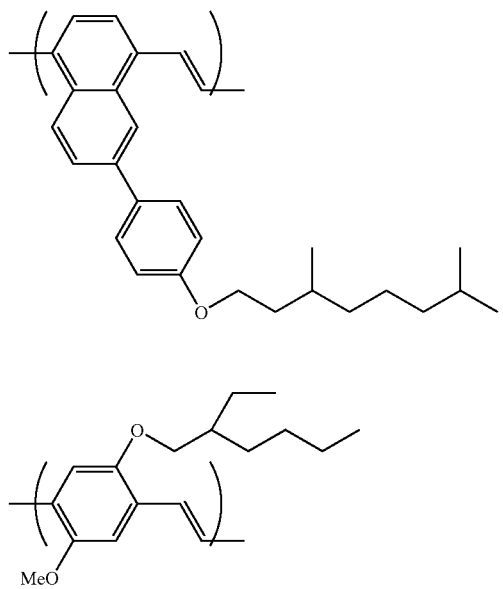

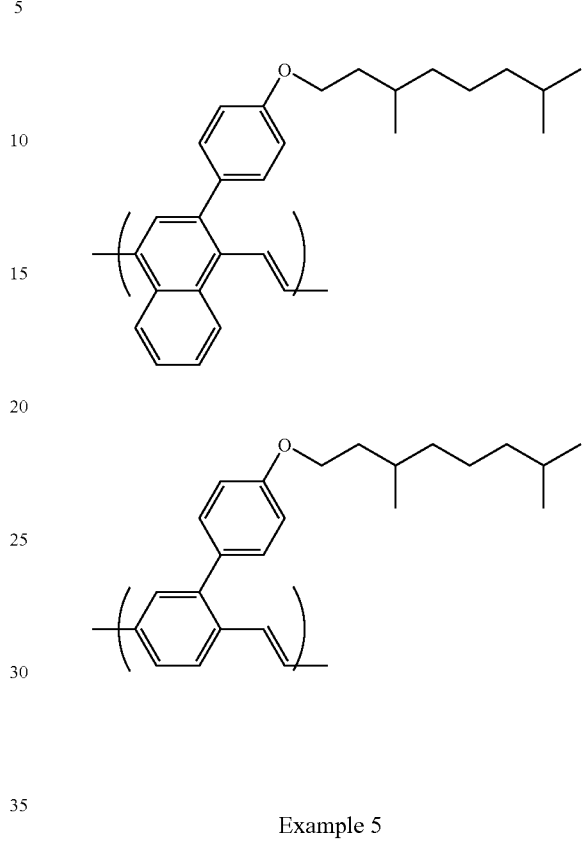

Example 4

Synthesis of Polymeric Fluorescent Substance 5

1,4-bis(bromomethyl)-2-{4-(3,7-dimethyloctyloxy) phenyl}naphthalene 0.546 g was reacted with triethyl phosphite, and a phosphonic ester was produced. The resulting phosphonic ester 0.66 g and 1,4-diformyl-2-{4'-(3,7-dimethyloctyloxy)phenyl}benzene 0.366 g were dissolved in THF (dehydration) 35 ml, then, the atmosphere in the system was replaced with nitrogen gas by nitrogen gas bubbling. Then, to this solution, a solution obtained by dissolving potassium tert-butoxide 0.67 g in THF (dehydration) 20 ml and replacing the atmosphere with nitrogen gas by nitrogen gas bubbling, was added at a room temperature in about 20 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and 0.57 g of a polymer was obtained. Next, after dissolving the polymer in about 30 ml of THF, methanol was added therein and resulting precipitate was collected. The precipitate was washed by ethanol, then dried at reduced pressure and 0.42 g of a polymer was obtained. The resulting polymer is referred to as Polymeric fluorescent substance 5.

Example 5

Synthesis of Polymeric Fluorescent Substance 6

2,6-bis(bromomethyl)-1,5-bis{4'-(3,7-dimethyloctyloxy) phenyl}naphthalene 0.778 g was reacted with triethylphosphite, and a phosphonic ester was produced. The resulting phosphonic ester 0.892 g, terephthalaldehyde 0.113 g and 2,5-dioctyloxyterephthalaldehyde 0.0624 g were dissolved in THF (dehydration) 35 ml, then, the atmosphere in the system was replaced with nitrogen gas by nitrogen gas bubbling. Then, to this solution, a solution obtained by dissolving potassium tert-butoxide 0.67 g in THF (dehydration) 30 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and 0.65 g of a polymer was obtained. Next, after dissolving the polymer in about 30 g of chloroform, methanol was added therein and resulting precipitate was collected. The precipitate was washed by ethanol, then dried at a reduced pressure and 0.45 g of a polymer was obtained. The resulting polymer is referred to as Polymeric fluorescent substance 6.

The polystyrene reduced number average molecular weight of polymeric fluorescent substance 6 was $1.2 \times 10^4$.

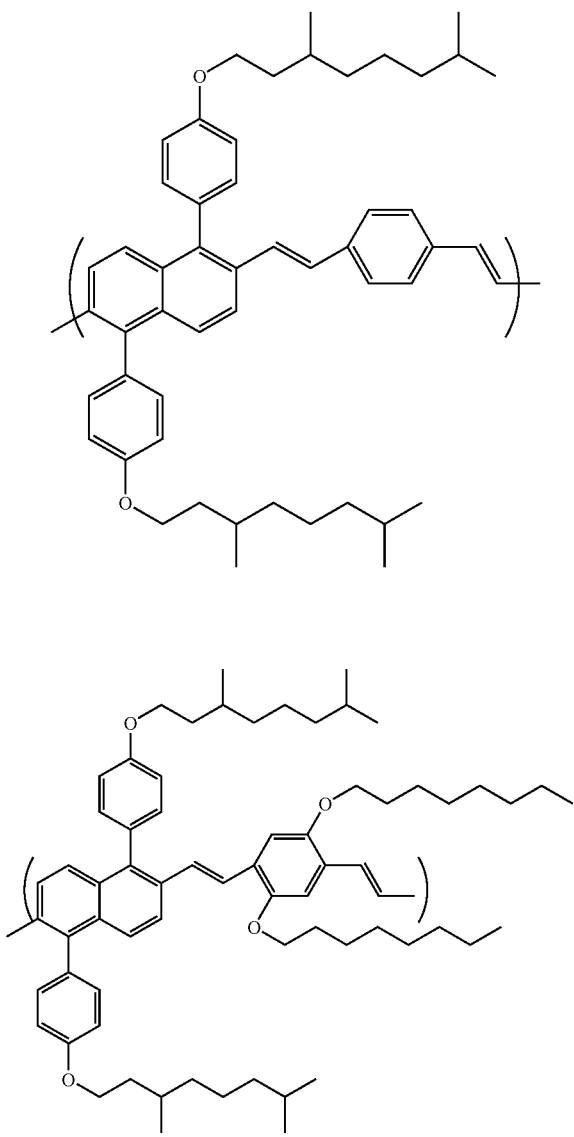

Example 6

Synthesis of Polymeric Fluorescent Substance 7

2,6-bis(bromomethyl)-1,5-bis{4'-(3,7-dimethyloctyloxy)phenyl}naphthalene 0.610 g was reacted with triethylphosphite, and a phoshonic ester was produced. The resulting phoshonic ester 0.700 g, and 2,5-dioctyloxyterephthalaldehyde 0.306 g were dissolved in THF (dehydration) 40 ml, then, the atmosphere in the system was replaced with nitrogen gas by nitrogen gas bubbling. Then, to this solution, a solution obtained by dissolving potassium tert-butoxide 0.46 g in THF (dehydration) 15 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and some amount of a polymer was obtained. Next, after dissolving the polymer in about 23 ml of chloroform, methanol was added therein and resulting precipitate was collected. The precipitate was washed by ethanol, then dried at a reduced pressure and 0.69 g of a polymer was obtained. The resulting polymer is referred to as Polymeric fluorescent substance 7.

The polystyrene reduced number average molecular weight of polymeric fluorescent substance 7 was $1.9 \times 10^4$.

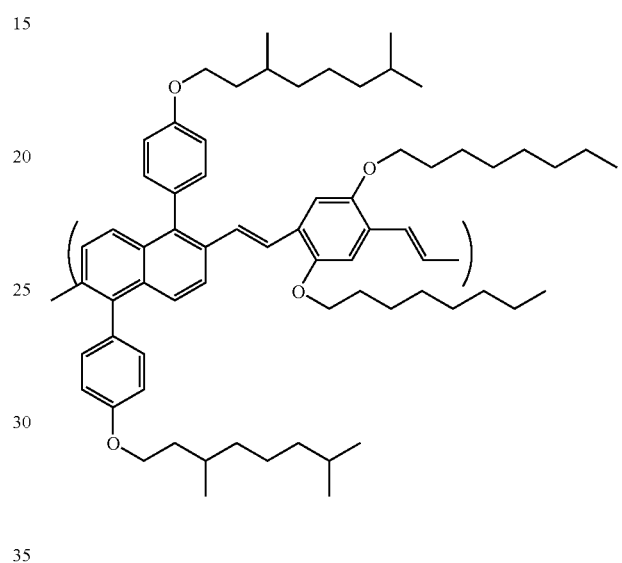

Example 7

Synthesis of Polymeric Fluorescent Substance 8

1,4-bis(bromomethyl)2,3-bis(2-ethylhexyloxy)naphthalene 4.360 g was reacted with triethylphosphite, and a phosphonic ester 5.04 g was produced. The resulting phosphonic ester 0.734 g and 2,5-dioctyloxyterephthalaldehyde 0.43 g were dissolved in THF (dehydration) 40 ml, then, the atmosphere in the system was replaced with nitrogen gas by nitrogen gas bubbling. Then, to this solution, a solution obtained by dissolving potassium tert-butoxide 0.46 g in THF (dehydration) 15 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and some amount of a polymer was obtained. Next, after dissolving the polymer in about 23 ml of chloroform, methanol was added therein and resulting precipitate was collected. The precipitate was washed by ethanol, then dried at a reduced pressure and 0.16 g of a polymer was obtained. The resulting polymer is referred to as Polymeric fluorescent substance 8.

The polystyrene reduced number average molecular weight of polymeric fluorescent substance 8 was $4.9 \times 10^3$.

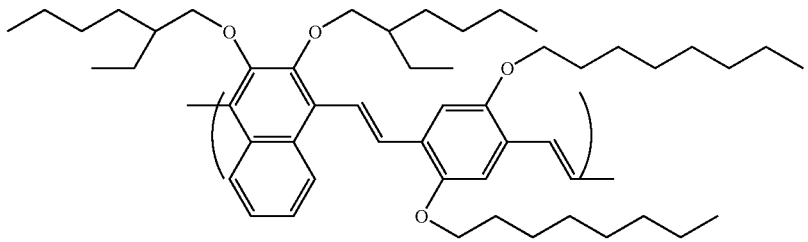

Example 8

Synthesis of Polymeric Fluorescent Substance 9

1,4-bis(bromomethyl)-3-{4'-(3,7-dimethyloctyloxy)phenyl}naphthalene 1.530 g was reacted with triethylphosphite, and a phoshonic ester 1.73 g was produced. The resulting phoshonic ester 0.713 g and 2,5-dioctyloxyterephthalaldehyde 0.43 g were dissolved in THF (dehydration) 40 ml, then, the atmosphere in the system was replaced with nitrogen gas by nitrogen gas bubbling. Then, to this solution, a solution obtained by dissolving potassium tert-butoxide 0.46 g in THF (dehydration) 15 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and some amount of a polymer was obtained. Next, after dissolving the polymer in about 23 ml of chloroform, methanol was added therein and resulting precipitate was collected. The precipitate was washed by ethanol, then dried at a reduced pressure and 0.10 g of a polymer was obtained. The resulting polymer is referred to as Polymeric fluorescent substance 9.

The polystyrene reduced number average molecular weight of polymeric fluorescent substance 9 was $7.8 \times 10^3$.

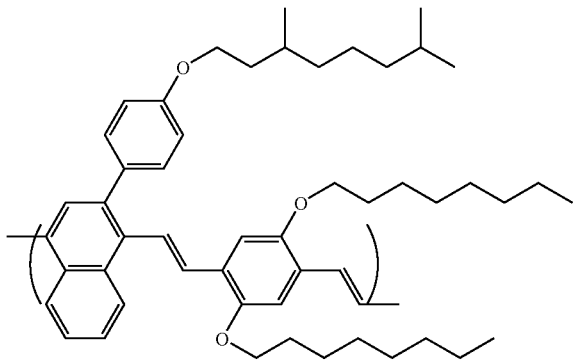

Example 9

Synthesis of Polymeric Fluorescent Substance 10

2,6-bis(bromomethyl)-4-{4'-(3,7-dimethyloctyloxy)phenyl}naphthalene 0.710 g was reacted with triethylphosphite, and a phoshonic ester was produced. The resulting phoshonic ester 0.330 g and 2,5-dioctyloxyterephthalaldehyde 0.195 g were dissolved in THF (dehydration) 18 g, then, the atmosphere in the system was replaced with nitrogen gas by nitrogen gas bubbling. Then, to this solution, a solution obtained by dissolving potassium tert-butoxide 0.23 g in THF (dehydration) 7 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and some amount of a polymer was obtained. Next, after dissolving the polymer in about 23 ml of chloroform, methanol was added therein and resulting precipitate was collected. The precipitate was washed by ethanol, then dried at a reduced pressure and 0.21 g of a polymer was obtained. The resulting polymer is referred to as Polymeric fluorescent substance 10.

The polystyrene reduced number average molecular weight of polymeric fluorescent substance 10 was $7.1 \times 10^3$.

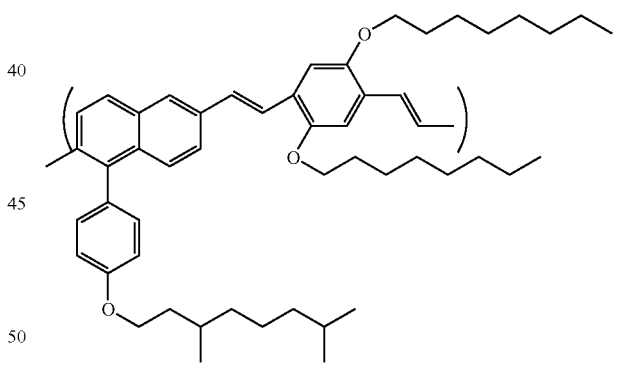

Example 10

Synthesis of Polymeric Fluorescent Substance 11

1,4-bis(bromomethyl)-2,3-bis(2-ethylhexyloxy)naphthalene 4.360 g was reacted with triethylphosphite, and a phosphonic ester 5.04 g was produced. The resulting phosphonic ester 0.680 g and 4,4'-diformylbiphenyl 0.21 g were dissolved in THF (dehydration) 40 ml, then, the atmosphere in the system was replaced with nitrogen gas by nitrogen gas bubbling. Then, to this solution, a solution obtained by dissolving potassium tert-butoxide 0.336 g in THF (dehydration) 15 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and a polymer was obtained. Next, after dissolving the polymer in about 23 ml of chloroform, methanol was added therein and resulting precipitate was collected. The precipitate was washed by ethanol, then dried at a reduced pressure and 0.10 g of a polymer was obtained. The resulting polymer is referred to as Polymeric fluorescent substance 11.

The polystyrene reduced number average molecular weight of polymeric fluorescent substance 11 was $1.5 \times 10^3$.

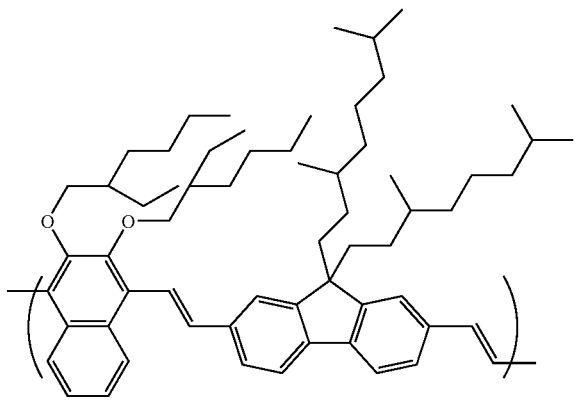

Example 12

Synthesis of Polymeric Fluorescent Substance 13

2,6-bis(bromomethyl)-4-{4'-(3,7-dimethyloctyloxy) phenyl}naphthalene 0.710 g was reacted with triethylphosphite, and a phosphonic ester was produced. The resulting phosphonic ester 0.120 g and 9,9-bis(3,7-dimethyloctyl)-2,7-diformyl-fluorene 0.251 g were dissolved in THF (dehydration) 27 ml, then, the atmosphere in the system was replaced with nitrogen gas by nitrogen gas bubbling. Then, to this solution, a solution obtained by dissolving potassium tert-butoxide 0.20 g in THF (dehydration) 7 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and some amount of a polymer was obtained. Next, after dissolving the polymer in about 23 ml of chloroform, methanol was added therein and resulting precipitate was collected. The precipitate was washed by ethanol, then dried at a reduced pressure and 0.03 g of a polymer was obtained. The resulting polymer is referred to as Polymeric fluorescent substance 13.

The polystyrene reduced number average molecular weight of polymeric fluorescent substance 13 was $3.3 \times 10^3$.

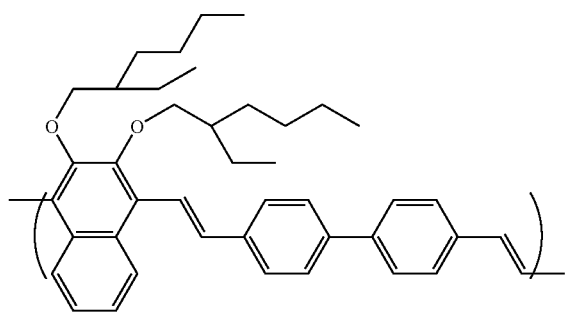

Example 11

Synthesis of Polymeric Fluorescent Substance 12

1,4-bis(bromomethyl)-2,3-bis(2-ethylhexyloxy)naphthalene 4.360 g was reacted with triethyl phosphate, and a phosphonic ester 5.04 g was produced. The resulting phosphonic ester 0.340 g and 9,9-bis(3,7-dimethyloctyl)-2,7-diformyl-fluorene 0.251 g were dissolved in THF (dehydration) 20 ml, then, the atmosphere in the system was replaced with nitrogen gas by nitrogen gas bubbling. Then, to this solution, a solution obtained by dissolving potassium tert-butoxide 0.20 g in THF (dehydration) 7 ml and replacing the atmosphere with nitrogen gas by nitrogen gas bubbling, was added at a room temperature in about 10 minutes. Subsequently, it was reacted at room temperature for 4 hours in nitrogen-gas atmosphere.

After the reaction, this solution was neutralized with adding acetic acid and poured into methanol, and resulting precipitate was collected. Next, this precipitate was washed with ethanol, dried under reduced pressure and some amount of a polymer was obtained. Next, after dissolving the polymer in about 23 ml of chloroform, methanol was added therein and resulting precipitate was collected. The precipitate was washed by ethanol, then dried at a reduced pressure and 0.10 g of a polymer was obtained. The resulting polymer is referred to as Polymeric fluorescent substance 12.

The polystyrene reduced number average molecular weight of polymeric fluorescent substance 12 was $7.0 \times 10^3$.

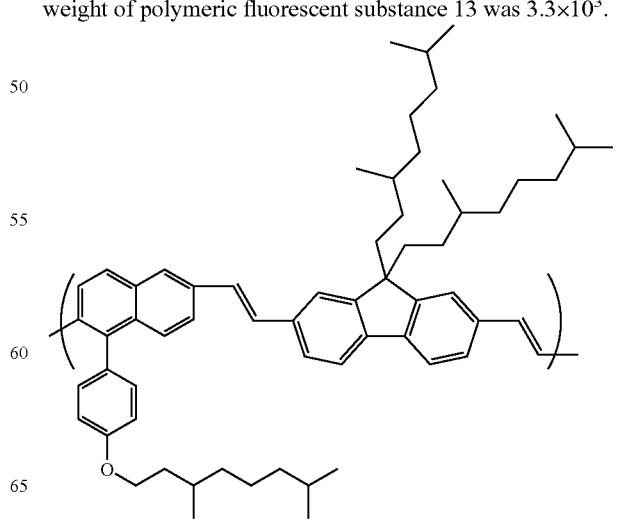

Example 13

Synthesis of Polymeric Fluorescent Substance 14

9,9-di-n-octylfluorene-2,7-di(ethylene boronate) 0.258 g and 2,6-dibromo-3-methylbenzofuran 0.134 g were dissolved in toluene 6 ml, and the atmosphere of the system was replaced with argon gas. Next, aliquat® 336 (tricaprylylmethylammonium chloride, manufactured by Aldrich) 24 mg and tetrakis triphenylphosphine palladium complex 3 mg were charged into this solution. Furthermore, 1.57 g of potassium carbonate aqueous solution having a concentration of 1 mol/L was charged. The mixture solution was refluxed for 15 hours to react. After the reaction, the solution was cooled and dropped into methanol:water (10:1/W:W) solution. The deposited solid was taken out and loosened in 70 ml of methanol. The resulting powdery solid was filtrated and dissolved in 15 ml of toluene, which was dropped into methanol 70 ml to deposit a solid. The solid was filtrated and powdery solid was obtained. The precipitate was dried at a reduced pressure and 0.101 g of a polymer was obtained. The resulting polymer is referred to as Polymeric fluorescent substance 14.

The polystyrene reduced number average molecular weight of polymeric fluorescent substance 14 was $7.5 \times 10^3$.

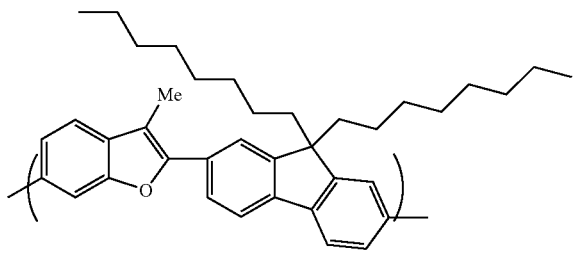

Example 14

Synthesis of Polymeric Fluorescent Substance 15

9,9-di-n-octylfluorene-2,7-di(ethylene boronate) 0.240 g and 5,8-dibromo-2,3-dimethylquinoxaline 0.136 g were dissolved in toluene 6 ml, and the atmosphere of the system was replaced with argon gas. Next, aliquat® 336 (manufactured by Aldrich) 22 mg and tetrakis triphenylphosphine palladium complex 3 mg were charged into this solution. Furthermore, 1.46 g of potassium carbonate aqueous solution having a concentration of 1 mol/L was charged. The mixture solution was refluxed for 10 hours to react. After the reaction, the solution was cooled and dropped into methanol:water (10:1/W:W) solution. The deposited solid was taken out and loosened in 67 ml of methanol. The resulting powdery solid was filtrated and dissolved in 14 ml of toluene, which was dropped into methanol 67 ml to deposit a solid. The solid was filtrated and powdery solid was obtained. The precipitate was dried at a reduced pressure and 0.213 g of a polymer was obtained. The resulting polymer is referred to as Polymeric fluorescent substance 15.

The polystyrene reduced number average molecular weight of polymeric fluorescent substance 15 was $1.55 \times 10^4$.

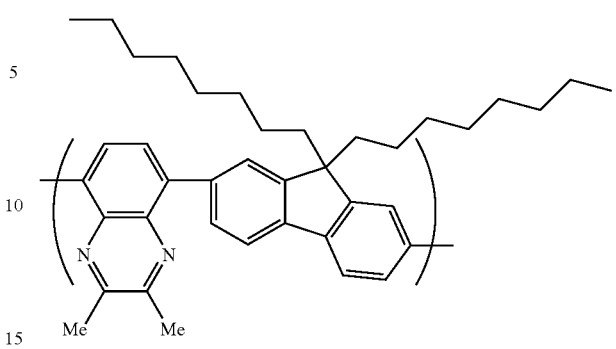

Example 15

Synthesis of Polymeric Fluorescent Substance 16

2,6-bis(chloromethyl)-4-{4'-(3,7-dimethyloctyloxy)phenyl}naphthalene 0.457 g, 2-methoxy-5-(2-ethylhexyloxy)-p-xylylene dichloride 0.0533 g and 2-methyl-5-(3,7-dimethyloctyl)-p-xylylene dibromide 0.360 g were dissolved in 1,4-dioxane (dehydration) 270 ml, then by nitrogen gas bubbling, the atmosphere of the system was replaced with nitrogen gas. This solution was raised to 95° C. in nitrogen-gas atmosphere. Then, to this solution, a solution obtained by dissolving potassium tert-butoxide 1.1 g in 1,4-dioxane (dehydration) 30 ml and replacing the atmosphere with nitrogen gas by nitrogen gas bubbling, was added in about 10 minutes. Subsequently, it was reacted at 95° C. for 2.5 hours in nitrogen-gas atmosphere.

After cooling, this solution was neutralized with adding acetic acid. About 200 ml of methanol was added to the solution and resulting precipitate was collected. Next, this precipitate was washed with ethanol and dried under reduced pressure, then 0.33 g of a polymer was obtained. Next, after dissolving the polymer in THF, reprecipitation purification was conducted by adding methanol to this solution. The resulting precipitate was washed by ethanol, then dried at reduced pressure and 0.25 g of a polymer was obtained. The resulting polymer is referred to as Polymeric fluorescent substance 16.

The polystyrene reduced number average molecular weight of polymeric fluorescent substance 16 was $5.4 \times 10^4$.

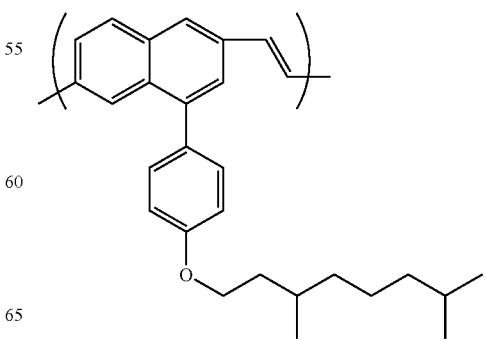

-continued

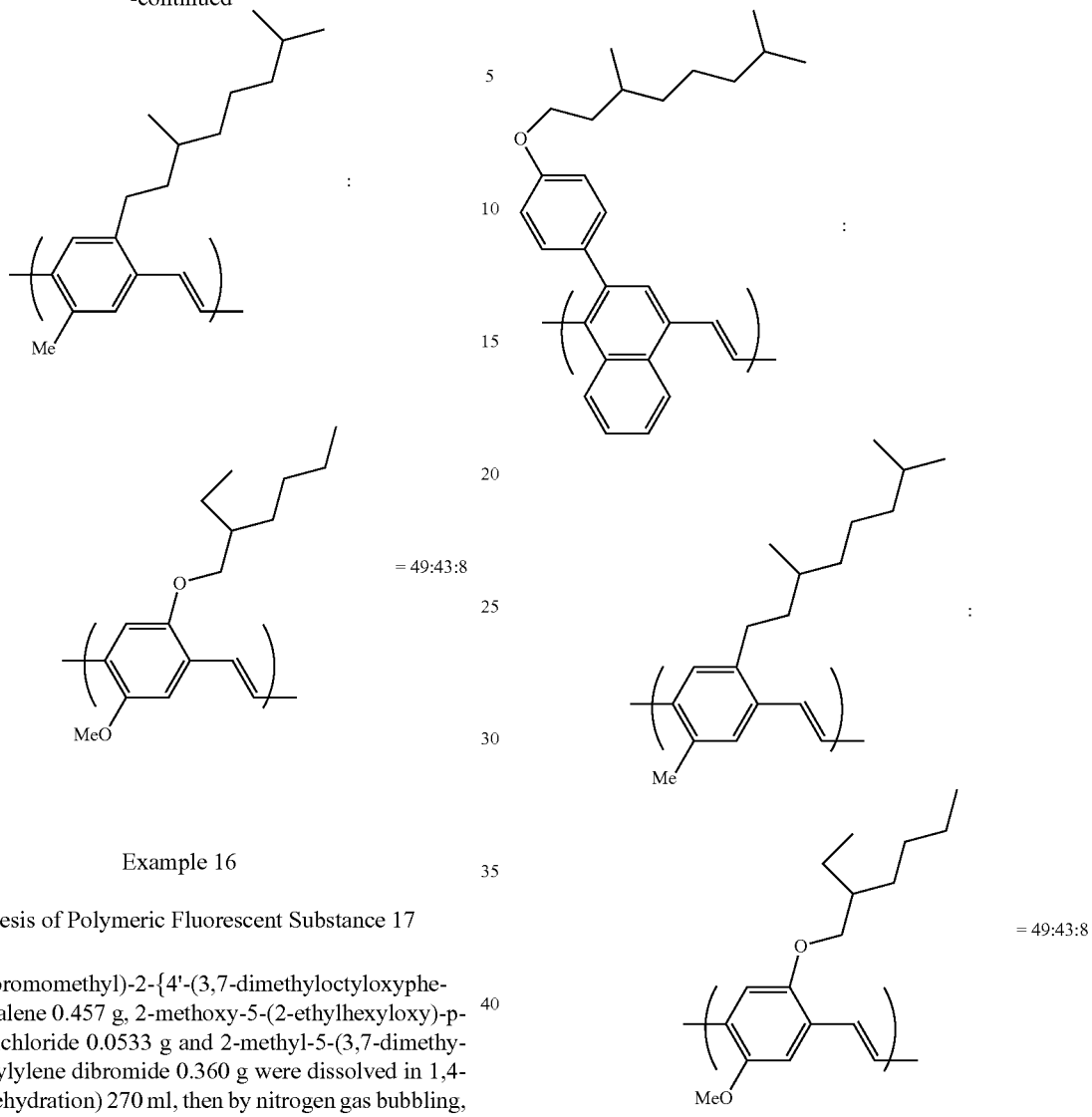

Example 16

Synthesis of Polymeric Fluorescent Substance 17

1,4-bis(bromomethyl)-2-{4'-(3,7-dimethyloctyloxyphenyl)naphthalene 0.457 g, 2-methoxy-5-(2-ethylhexyloxy)-p-xylylene dichloride 0.0533 g and 2-methyl-5-(3,7-dimethyloctyl)-p-xylylene dibromide 0.360 g were dissolved in 1,4-dioxane (dehydration) 270 ml, then by nitrogen gas bubbling, the atmosphere of the system was replaced with nitrogen gas. This solution was raised to 95° C. in nitrogen-gas atmosphere. Then, to this solution, a solution obtained by dissolving potassium tert-butoxide 1.1 g in 1,4-dioxane (dehydration) 30 ml and replacing the atmosphere with nitrogen gas by nitrogen gas bubbling, was added in about 10 minutes. Subsequently, it was reacted at 95° C. for 3 hours in nitrogen-gas atmosphere.

After cooling, this solution was neutralized with adding acetic acid. About 200 ml of methanol was added to the solution and resulting precipitate was collected. Next, this precipitate was washed with ethanol and dried under reduced pressure, then 0.30 g of a polymer was obtained. Next, after dissolving the polymer in THF, reprecipitation purification was conducted by adding methanol to this solution. The resulting precipitate was washed by ethanol, then dried at reduced pressure and 0.21 g of a polymer was obtained. The resulting polymer is referred to as Polymeric fluorescent substance 17.

The polystyrene reduced number average molecular weight of polymeric fluorescent substance 17 was $4.5 \times 10^4$.

Example 17

Synthesis of Polymeric Fluorescent Substance 18

1,4-bis(bromomethyl)-6-{4'-(3,7-dimethyloctyloxyphenyl)naphthalene 0.0732 g, 2-{4'-(3,7-dimethyloctyloxyphenyl)-p-xylylene dichloride 0.407 g and 2-methyl-5-(3,7-dimethyloctyl)-p-xylylene dibromide 0.360 g were dissolved in 1,4-dioxane (dehydration) 270 ml, then by nitrogen gas bubbling, the atmosphere of the system was replaced with nitrogen gas. This solution was raised to 95° C. in nitrogen-gas atmosphere. Then, to this solution, a solution obtained by dissolving potassium tert-butoxide 1.1 g in 1,4-dioxane (dehydration) 30 ml and replacing the atmosphere with nitrogen gas by nitrogen gas bubbling, was added in about 10 minutes. Subsequently, it was reacted at 95° C. for 2.5 hours in nitrogen-gas atmosphere.

After cooling, this solution was neutralized with adding acetic acid. About 200 ml of methanol was added to the solution and resulting precipitate was collected. Next, this precipitate was washed with ethanol and dried under reduced pressure, then 0.36 g of a polymer was obtained. Next, after dissolving the polymer in THF, reprecipitation purification was conducted by adding methanol to this solution. The resulting precipitate was washed by ethanol, then dried at reduced pressure and 0.36 g of a polymer was obtained. The resulting polymer is referred to as Polymeric fluorescent substance 18.

The polystyrene reduced number average molecular weight of polymeric fluorescent substance 18 was $1.6 \times 10^5$.

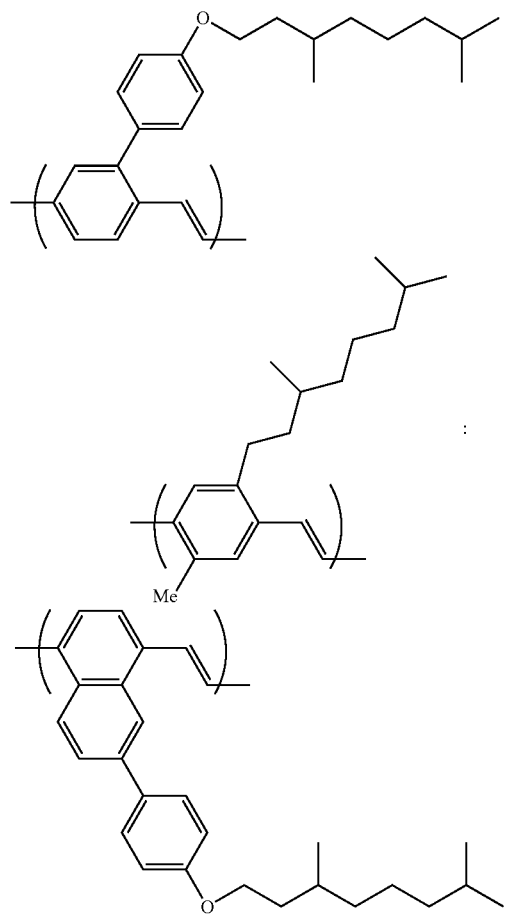

Example 18

Synthesis of Polymeric Fluorescent Substance 19

2,6-diformyl-4-{4'-(3,7-dimethyloctyloxy)phenyl}naphthalene 0.208 g, 2,5-di-n-octyl-p-xylylene diphosphonic acid diethyl ester 0.301 g, 2,5-di-n-octyloxy-1,4-terephthalaldehyde 0.0156 g and 2,5-di-n-octyloxy-p-xylylene diphosphonic acid diethyl ester 0.0254 g were dissolved in THF (dehydration) 20 ml, then by nitrogen gas bubbling, the atmosphere of the system was replaced with nitrogen gas. This solution was raised to 95° C. in nitrogen-gas atmosphere. Then, to this solution, a solution obtained by dissolving potassium tert-butoxide 0.336 g in THF (dehydration) 5 ml and replacing the atmosphere with nitrogen gas by nitrogen gas bubbling, was added in about 10 minutes. Subsequently, it was reacted at 95° C. for 2.5 hours in nitrogen-gas atmosphere.

After cooling, this solution was neutralized with adding acetic acid. About 200 ml of methanol was added to the solution and resulting precipitate was collected. Next, this precipitate was washed with ethanol and dried under reduced pressure, then 0.29 g of a polymer was obtained. Next, after dissolving the polymer in THF, reprecipitation purification was conducted by adding methanol to this solution. The resulting precipitate was washed by ethanol, then dried at reduced pressure and 0.15 g of a polymer was obtained. The resulting polymer is referred to as Polymeric fluorescent substance 19.

The polystyrene reduced number average molecular weight of polymeric fluorescent substance 19 was $7.3 \times 10^3$.

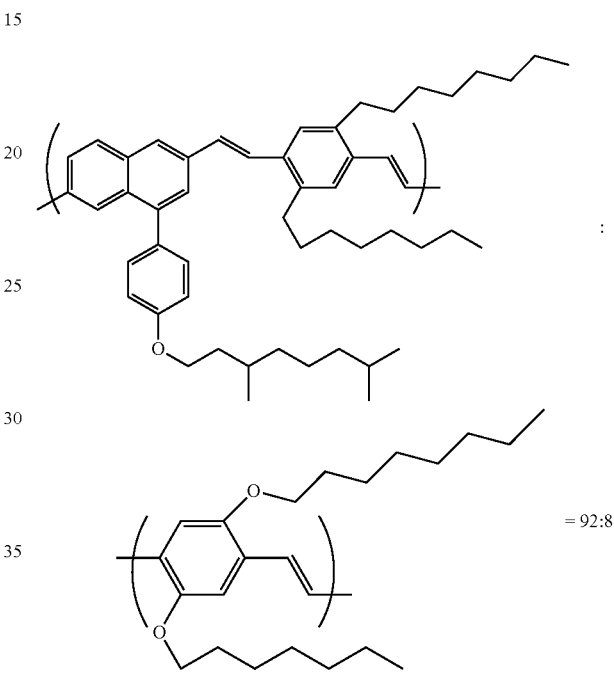

Example 19

Synthesis of Polymeric Fluorescent Substance 20

2,6-diformyl-4-{4'-(3,7-dimethyloctyloxy)phenyl}naphthalene 0.208 g and 2,5-di-n-octyl-p-xylylene diphosphonic acid diethyl ester 0.301 g were dissolved in THF (dehydration) 20 ml, then by nitrogen gas bubbling, the atmosphere of the system was replaced with nitrogen gas. This solution was raised to 95° C. in nitrogen-gas atmosphere. Then, to this solution, a solution obtained by dissolving potassium tert-butoxide 0.336 g in THF (dehydration) 5 ml and replacing the atmosphere with nitrogen gas by nitrogen gas bubbling, was added in about 10 minutes. Subsequently, it was reacted at 95° C. for 2.5 hours in nitrogen-gas atmosphere.

After cooling, this solution was neutralized with adding acetic acid. About 200 ml of methanol was added to the solution and resulting precipitate was collected. Next, this precipitate was washed with ethanol and dried under reduced pressure, then 0.29 g of a polymer was obtained. Next, after dissolving the polymer in THF, reprecipitation purification was conducted by adding methanol to this solution. The resulting precipitate was washed by ethanol, then dried at reduced pressure and 0.25 g of a polymer was obtained. The resulting polymer is referred to as Polymeric fluorescent substance 20.

The polystyrene reduced number average molecular weight of polymeric fluorescent substance 20 was $4.4 \times 10^3$.

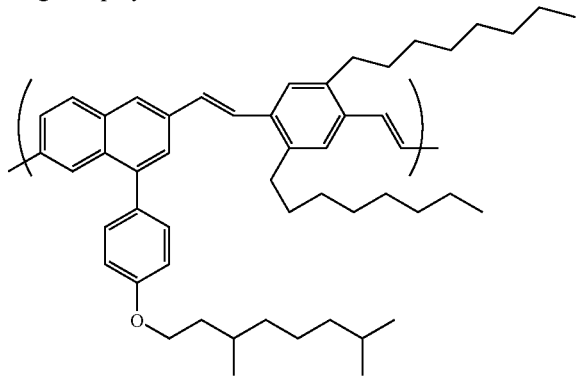

Example 20

Synthesis of Polymeric Fluorescent Substance 21

2,6-diformyl-4-{4'-(3,7-dimethyloctyloxy) phenyl}naphthalene 0.208 g and 2-methoxy-5-(2-ethylhexyloxy)-p-xylene diphosphonic acid diethyl ester 0.268 g were dissolved in THF (dehydration) 20 ml, then by nitrogen gas bubbling, the atmosphere of the system was replaced with nitrogen gas. This solution was raised to 95° C. in nitrogen-gas atmosphere. Then, to this solution, a solution obtained by dissolving potassium tert-butoxide 0.336 g in THF (dehydration) 5 ml and replacing the atmosphere with nitrogen gas by nitrogen gas bubbling, was added in about 10 minutes. Subsequently, it was reacted at 95° C. for 2.5 hours in nitrogen-gas atmosphere.

After cooling, this solution was neutralized with adding acetic acid. About 200 ml of methanol was added to the solution and resulting precipitate was collected. Next, this precipitate was washed with ethanol and dried under reduced pressure, then 0.29 g of a polymer was obtained. Next, after dissolving the polymer in THF, reprecipitation purification was conducted by adding methanol to this solution. The resulting precipitate was washed by ethanol, then dried at reduced pressure and 0.28 g of a polymer was obtained. The resulting polymer is referred to as Polymeric fluorescent substance 21.

The polystyrene reduced number average molecular weight of polymeric fluorescent substance 21 was $5.5 \times 10^3$.

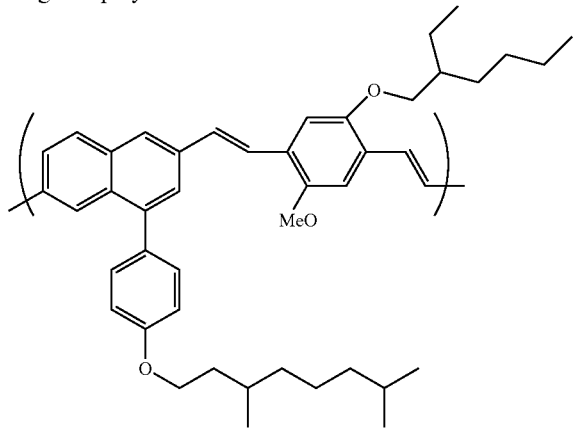

Example 21

Evaluation of Fluorescent Property

A 0.4 wt % chloroform solution of each of polymeric fluorescent substances 4 to 21 were spin-coated on quartz, to form a thin film of polymeric fluorescent substance 4 to 21, respectively. The ultraviolet visible absorption spectrum and fluorescent spectrum of the thin films were measured by using a ultraviolet visible absorption spectrophotometer (UV3500 manufactured by Hitachi, Ltd.) and a fluorescent spectrophotometer (850 manufactured by Hitachi, Ltd.), respectively. For calculation of fluorescent strength, a fluorescent spectrum excited at 410 nm was used. The area of fluorescent spectra plotted against wave-number on the abscissa was divided by the absorption at 410 nm, to obtain a relative value of the fluorescent strength.

The fluorescent peak wave-lengths and relative values of the fluorescent strength of the polymeric fluorescent substances 1 to 18 are shown in Table 1.

TABLE 1

| Fluorescent properties of polymeric fluorescent substances | | |
|---|---|---|
| Polymeric fluorescent substance | Fluorescent peak wave-length (nm) | Fluorescent strength (a.u.) |
| 4 | 618 | 0.09 |
| 5 | 544 | 1.11 |
| 6 | 524 | 2.11 |
| 7 | 540 | 1.09 |
| 8 | 558 | 0.63 |
| 9 | 572 | 0.44 |
| 10 | 568 | 0.12 |
| 11 | 496 | 2.00 |
| 12 | 504 | 1.66 |
| 13 | 480 | 1.05 |
| 14 | 446 | 0.82 |
| 15 | 480 | 0.33 |
| 16 | 554 | 1.66 |
| 17 | 552 | 0.59 |
| 18 | 574 | 0.29 |
| 19 | 554 | 1.37 |
| 20 | 538 | 1.68 |
| 21 | 566 | 0.36 |

Example 22

Production and Evaluation of the Device

On a glass substrate on which an ITO film had been made at a thickness of 150 nm according to a sputtering method, a film having a thickness of 50 nm was formed using a solution (Baytron, manufactured by Bayer) of poly(ethylenedioxythiophene)/polystyrenesulfonic acid by spin coating, and the film was dried at 120° C. for 10 minutes on a hot plate. Then, a film having a thickness of about 60 nm was formed using a 0.75 wt % toluene solution of polymeric fluorescent substance 16 by spin coating. Further, this film was dried at 80° C. for 1 hour under reduced pressure, then, with using aluminum alloy containing 0.5 wt % of lithium, aluminum-lithium alloy was vapor-deposited at about 40 nm as a cathode to produce a polymer LED. In any vapor deposition, the degree of vacuum was 1 to $8 \times 10^{-6}$ Torr. Voltage was applied on the resulted device, to give EL light emission from the polymeric fluorescent substance. The strength of EL light emission was approximately in proportion to the current density. Voltage at which the luminance exceeds 1 cd/m² was 2.3V and the maximum light emitting efficiency was 3.5 cd/A.

Example 23

A polymer LED was produced as the same manner with the above Example except that a 0.95 wt % chloroform solution of polymeric fluorescent substance 20. Voltage was applied on the resulted device, to give EL light emission from the polymeric fluorescent substance. The strength of EL light emission was approximately in proportion to the current density. Voltage at which the luminance exceeds 1 cd/m$^2$ was 3.0V and the maximum light emitting efficiency was 4.0 cd/A.

The polymeric fluorescent substance of the present invention contains a condensed aromatic ring such as naphthalene and an arylene group such as fluorene, and shows strong fluorescence, and can be suitably used as a polymer LED or a pigment for laser. The polymer LED using this polymeric fluorescent substance is a polymer LED of high performance which can be driven at lower voltage with high efficiency. Therefore, this polymer LED can be preferably used as a back light of a liquid crystal display, a light source in the form of curved surface or flat surface for illumination, or a display device of segment type, and in apparatuses such as a flat panel display of dot matrix, and the like.

What is claimed is:

1. A polymeric fluorescent substance exhibiting fluorescence in the solid state, having a polystyrene reduced number-average molecular weight of $1 \times 10^3$ to $1 \times 10^8$, and comprising one or more repeating units of formula (1) and one or more repeating units of formula (8), and the amount of repeating units represented by the formula (1) is 0.1 mol % or more and 50 mol % or less based on the total amount of the repeating units represented by the formulae (1) and (8),

—Ar$_1$—(CR$_1$=CR$_2$)$_n$—      (1)

in the formula, Ar$_1$ is a divalent group represented by formula (1'); R$_1$ and R$_2$ each independently represent a group selected from a hydrogen atom, alkyl groups, aryl groups, monovalent heterocyclic compound groups and cyano group; and n=0,

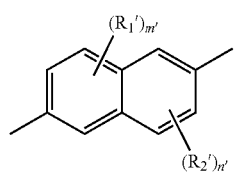
(1')

in the formula, R$_1$' and R$_2$' represent each independently a group selected from alkyl group, alkoxy group, alkylthio group, alkylsilyl group, alkylamino group, alkylphenyl group, alkoxyphenyl group, aryloxy group, arylsilyl group, arylamino group, arylalkyl group, arylalkoxy group, arylalkylsilyl group, arylalkylamino group, arylalkenyl group, arylalkynyl group, monovalent heterocyclic compound group, and cyano group; m' and n' are integers of 0-3 each independently; however, m' and n' are not 0 simultaneously; when m' is two or more, two or more R$_1$' may be the same or different; when n' is two or more, a plurality of R$_2$' may be the same or different; moreover, R$_1$' and R$_2$' may be connected to form a ring,

—Ar$_2$—(CR$_{36}$=CR$_{37}$)$_n$—      (8)

in the formula, Ar$_2$ represents a group represented by formula (2'),

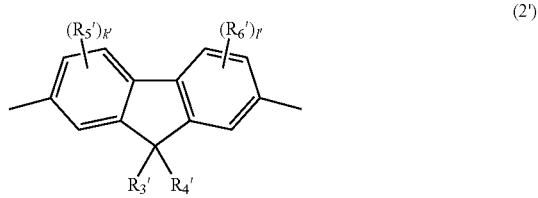
(2')

in the formula, R$_3$' and R$_4$' represent independently a group selected from a hydrogen atom, alkyl group, aryl group, and a heterocyclic compound group; R$_5$' and R$_6$' show each independently a group selected from alkyl group, alkoxy group, alkylthio group, alkylsilyl group, alkylamino group, aryl group, aryloxy group, arylsilyl group, arylamino group, arylalkyl group, arylalkoxy group, arylalkylsilyl group, arylalkylamino group, arylalkenyl group, arylalkynyl group, monovalent heterocyclic compound group, and cyano group; k' and l' are integers of 0-3 each independently; when k' is two or more, a plurality of R$_5$' may be the same or different; when l' is two or more, a plurality of R$_6$' may be the same or different; R$_3$'-R$_6$' may be connected to form a ring; R$_{36}$ and R$_{37}$ each independently represent a group selected from a hydrogen atom, alkyl groups, aryl groups, monovalent heterocyclic compound groups and a cyano group; and m=0.

2. The polymeric fluorescent substance according to claim 1 wherein the total amount of repeating units represented by formulae (1) and (8) is 50 mol % or more based on the total amount of all repeating units.

3. A polymer light emitting device comprising at least a light emitting layer between a pair of electrodes composed of an anode and a cathode at least one of which is transparent or semi-transparent wherein the light emitting layer comprises a polymeric fluorescent substance according to claim 1.

4. The polymer light emitting device according to claim 3, further comprising a layer comprising a conducting polymer disposed between one electrode and the light emitting layer such that the layer containing a conducting polymer is adjacent to said electrode.

5. The polymer light emitting device according to claim 3, further comprising an insulation layer having a thickness of 2 nm or less disposed between one electrode and the light emitting layer such that the insulation layer is adjacent to said electrode.

6. The polymer light emitting device according to any one of claims 3 to 5, further comprising a layer comprising an electron transporting compound disposed between the cathode and the light emitting layer such that the layer comprising an electron transporting compound is adjacent to said light emitting layer.

7. The polymer light emitting device according to any one of claims 3 to 5, further comprising a layer comprising a hole transporting compound disposed between the anode and the light emitting layer such that the layer comprising a hole transporting compound is adjacent to said light emitting layer.

8. The polymer light emitting device according to any one of claims 3 to 5, further comprising a layer comprising an electron transporting compound disposed between the cathode and the light emitting layer and a layer comprising a hole transporting compound disposed between the anode and the light emitting layer such that the layer comprising an electron transporting compound is adjacent to said light emitting layer, and the layer comprising a hole transporting compound is adjacent to said light emitting layer.

9. A flat light source comprising the polymer light emitting device of any one of claims 3 to 5.

10. A segment display comprising the polymer light emitting device of any one of claims 3 to 5.

11. A dot matrix display comprising the polymer light emitting device of any one of claims 3 to 5.

12. A liquid crystal display comprising the polymer light emitting device of any one of claims 3 to 5 as a back-light.

13. The polymeric fluorescent substance of claim 1 having a polystyrene reduced number-average molecular weight of at least $1.9 \times 10^4$.

* * * * *